(12) United States Patent
Park et al.

(10) Patent No.: US 12,108,677 B2
(45) Date of Patent: Oct. 1, 2024

(54) THERMOELECTRIC COMPOSITE, PREPARATION METHOD THEREFOR, AND THERMOELECTRIC DEVICE AND SEMICONDUCTOR DEVICE EACH COMPRISING THERMOELECTRIC COMPOSITE

(71) Applicants: Industry-University Cooperation Foundation Hanyang University Erica Campus, Ansan-si (KR); Ajou University Industry-Academic Cooperation Foundation, Suwon-si (KR)

(72) Inventors: Tae Joo Park, Ansan-si (KR); Sang Woon Lee, Suwon-si (KR); Dae Woong Kim, Ansan-si (KR); Tae Jun Seok, Ansan-si (KR); Jae Hyun Yoon, Yongin-si (KR); Ji Hyeon Choi, Ansan-si (KR)

(73) Assignees: Industry-University Cooperation Foundation Hanyang University Erica Campus, Ansan-si (KR); Ajou University Industry-Academic Cooperation Foundation, Suwon-si (KR)

( * ) Notice: Subject to any disclaimer, the term of this patent is extended or adjusted under 35 U.S.C. 154(b) by 0 days.

(21) Appl. No.: 18/163,694

(22) Filed: Feb. 2, 2023

(65) Prior Publication Data
US 2023/0189650 A1    Jun. 15, 2023

Related U.S. Application Data

(63) Continuation of application No. PCT/KR2021/012210, filed on Sep. 8, 2021.

(30) Foreign Application Priority Data

Sep. 8, 2020  (KR) .................... 10-2020-0114297
Sep. 8, 2020  (KR) .................... 10-2020-0114298
Sep. 8, 2020  (KR) .................... 10-2020-0114299

(51) Int. Cl.
*H10N 10/855* (2023.01)
*H01L 23/427* (2006.01)
(Continued)

(52) U.S. Cl.
CPC ......... *H10N 10/855* (2023.02); *H01L 23/427* (2013.01); *H10N 10/01* (2023.02);
(Continued)

(58) Field of Classification Search
CPC ...... H10N 10/855; H10N 10/13; H10N 10/01; H10N 10/82; H10N 10/817; H01L 23/427
See application file for complete search history.

(56) References Cited

U.S. PATENT DOCUMENTS 7,432,526 B2    10/2008   Van de Walle et al.
11,081,577 B2    8/2021   Kim et al.
(Continued)

FOREIGN PATENT DOCUMENTS

JP    2015-048251 A    3/2015
JP    2016-207708 A    12/2016
(Continued)

OTHER PUBLICATIONS

Maeng et al., "Studies on optical, structural and electrical properties of atomic layer deposited Al-doped ZnO thin films with various Al concentrations and deposition temperatures", J. Phys. D: Appl. Phys. 44 (2011) 445305 (7pp) (Year: 2011).*

(Continued)

*Primary Examiner* — Tae-Sik Kang
(74) *Attorney, Agent, or Firm* — Finch & Maloney PLLC

(57) ABSTRACT

Provided is a preparation method for a thermoelectric composite. The preparation method for a thermoelectric composite comprises the steps of: preparing a base substrate containing a first binary metal oxide; and providing a metal precursor and a reaction material containing oxygen (O) onto the base substrate to form a material film containing a second biliary metal oxide resulting from the reaction of the (Continued)

metal precursor and the reaction material, wherein in the step of forming the material film, a 2-dimensional electron gas is generated between the base substrate and the material film as the material film is formed on the base substrate.

6 Claims, 32 Drawing Sheets

(51) Int. Cl.
  *H10N 10/01* (2023.01)
  *H10N 10/13* (2023.01)
  *H10N 10/817* (2023.01)
  *H10N 10/82* (2023.01)
(52) U.S. Cl.
  CPC ........... *H10N 10/13* (2023.02); *H10N 10/817* (2023.02); *H10N 10/82* (2023.02)

(56) References Cited

U.S. PATENT DOCUMENTS

| | | |
|---|---|---|
| 2004/0113184 A1 | 6/2004 | Kazutaka et al. |
| 2005/0040481 A1 | 2/2005 | Shimizu et al. |
| 2005/0170667 A1 | 8/2005 | Conley, Jr. et al. |
| 2006/0043504 A1 | 3/2006 | Ahn et al. |
| 2008/0087890 A1 | 4/2008 | Ahn et al. |
| 2008/0233762 A1 | 9/2008 | Hong |
| 2011/0065237 A1 | 3/2011 | Bennahmias et al. |
| 2012/0292584 A1 | 11/2012 | Rocklein et al. |
| 2012/0309163 A1 | 12/2012 | Kiyomura et al. |
| 2013/0264576 A1 | 10/2013 | Onizawa |
| 2013/0264680 A1 | 10/2013 | Auciello et al. |
| 2013/0277636 A1 | 10/2013 | Lee et al. |
| 2014/0103283 A1 | 4/2014 | Park et al. |
| 2014/0253183 A1 | 9/2014 | Holmes |
| 2015/0059818 A1 | 3/2015 | Koumoto et al. |
| 2016/0365133 A1 | 12/2016 | Ino et al. |
| 2017/0243967 A1* | 8/2017 | Kim .................... H01L 29/7786 |

FOREIGN PATENT DOCUMENTS

| | | |
|---|---|---|
| JP | 2018-056538 A | 4/2018 |
| KR | 10-2013-0053576 A | 5/2013 |
| KR | 10-2013-0118095 A | 10/2013 |
| KR | 10-1348937 B1 | 1/2014 |
| KR | 10-2014-0046809 A | 4/2014 |
| KR | 10-2014-0052162 A | 5/2014 |
| KR | 10-1450093 B1 | 10/2014 |
| KR | 10-1522819 B1 | 5/2015 |

OTHER PUBLICATIONS

Ahn, C.H., et al; "Artificial semiconductor/insulator superlattice channel structure for high-performance oxide thin-film transistors", Scientific Reports; 3; 2737 (2013) 6 pages.

Hsieh, H, et al, "Amorphous ZnO transparent thin-film transistors fabricated by fully lithographic and etching processes" Applied Physics Letters; 91; 013502-1 (2007) 4 pages.

Seok, T.J. et al.; "In Situ Observation of Two-Dimensional Electron Gas Createion at the Interface of an Atomic Layer- Deposited Al2O3/TiO2 Thin-Film Heterostructure", Chem. Mater. 2020, 32, pp. 7662-7669 (2020).

International Search Report and Written Opinion mailed Dec. 16, 2021 for International Application No. PCT/KR2021/012210, 10 pages.

* cited by examiner

THERMOELECTRIC COMPOSITE, PREPARATION METHOD THEREFOR, AND THERMOELECTRIC DEVICE AND SEMICONDUCTOR DEVICE EACH COMPRISING THERMOELECTRIC COMPOSITE

CROSS REFERENCE TO RELATED APPLICATIONS

This is a continuation of PCT/KR2021/012210 (filed 8 Sep. 2021), which claims the benefit of Republic of Korea Patent Application KR 10-2020-0114297 (filed 8 Sep. 2020), Republic of Korea Patent Application KR 10-2020-0114298 (filed 8 Sep. 2020), and Republic of Korea Patent Application KR 10-2020-0114299 (filed 8 Sep. 2020). The entire disclosure of each of these priority applications is hereby incorporated by reference herein.

TECHNICAL FIELD

The present invention relates to a thermoelectric composite, a preparation method therefore, and a thermoelectric element and a semiconductor device including a thermoelectric composite, and more particularly, to a thermoelectric composite, a preparation method therefore, and a thermoelectric element and a semiconductor device including a thermoelectric composite in which a high-concentration 2-dimensional electron gas is generated at oxide heterojunction.

BACKGROUND ART

A thermoelectric effect signifies the reversible and direct energy conversion between heat and electricity, and refers to a phenomenon caused by movements of electrons and holes inside a material. The thermoelectric effect is divided into the Peltier effect, which utilizes the temperature difference generated at both ends by using the heat flow famed by the current applied from the outside, and the Seebeck effect, which generates electricity using the electromotive force generated from the temperature difference across the material.

The aim of conventional thermoelectric elements is to increase the Seebeck coefficient to increase the thermoelectric effect. In the case of $Bi_2Te_3$ mainly widely used, ZT approaches 1 at room temperature. Alternatively, a device is manufactured by inserting a material for reducing the lattice thermal conductivity or increasing the electron conductivity in the above material. However, there is a limit in improvement since the physical properties of the material itself are fixed. Accordingly, various studies have been conducted to improve the thermoelectric effect.

TECHNICAL PROBLEM

One technical problem to be solved by the present invention is to provide a thermoelectric composite, a preparation method therefore, and a thermoelectric element and a semiconductor device including a thermoelectric composite in which two-dimensional electron gas is applied.

Another technical problem to be solved by the present invention is to provide a thermoelectric composite, a preparation method therefore, and a thermoelectric element and a semiconductor device including a thermoelectric composite in which a sheet resistance is reduced at an interface between binary material films different from each other.

Still another technical problem to be solved by the present invention is to provide a thermoelectric composite, a preparation method therefore, and a thermoelectric element and a semiconductor device including a thermoelectric composite in which a carrier density is increased at an interface between binary material films different from each other.

Still another technical problem to be solved by the present invention is to provide a thermoelectric composite, a preparation method therefore, and a thermoelectric element and a semiconductor device including a thermoelectric composite in which a thermal conductivity is reduced.

Still another technical problem to be solved by the present invention is to provide a thermoelectric composite, a preparation method therefore, and a thermoelectric element and a semiconductor device including a thermoelectric composite in which an electrical conductivity is improved.

Still another technical problem to be solved by the present invention is to provide a thermoelectric composite, a preparation method therefore, and a thermoelectric element and a semiconductor device including a thermoelectric composite in which a carrier density is proportional to the Seebeck coefficient.

Still another technical problem to be solved by the present invention is to provide a thermoelectric composite, a preparation method therefore, and a thermoelectric element and a semiconductor device including a thermoelectric composite so as to control the Seebeck coefficient by controlling a manufacturing process temperature of a binary material film.

The technical problems to be solved by the present invention are not limited to the above description.

TECHNICAL SOLUTION

In order to solve the above technical problems, the present invention provides a preparation method for a thermoelectric composite.

According to one embodiment, the preparation method for a thermoelectric composite includes: preparing a base substrate containing a first binary metal oxide; and providing a metal precursor and a reaction material containing oxygen (O) onto the base substrate to form a material film containing a second binary metal oxide resulting from reaction of the metal precursor and the reaction material, wherein the forming of the material film includes generating a 2-dimensional electron gas between the base substrate and the material film as the material film is formed on the base substrate.

According to one embodiment, the forming of the material film may include: providing a first metal precursor and the reaction material on the base substrate; and providing a second metal precursor and the reaction material on the base substrate, wherein the providing of the first metal precursor and the reaction material is performed prior to the providing of the second metal precursor and the reaction material.

According to one embodiment, the first precursor may include trimethylaluminum (TMA), and the second precursor may include dimethylaluminumisopropoxide (DMAIP).

According to one embodiment, the providing of the first metal precursor and the reaction material may be defined as a first unit process, and the providing of the second metal precursor and the reaction material may be defined as a second unit process, in which each of the first unit process and the second unit process may be repeatedly performed multiple times.

According to one embodiment, a process temperature in the forming of the material film may be controlled, so that a sheet resistance at an interface between the base substrate and the material film may be controlled.

According to one embodiment, a process temperature in the forming of the material film may be controlled, so that a carrier density at an interface between the base substrate and the material film may be controlled.

According to one embodiment, the reaction material may include water ($H_2O$).

In order to solve the above technical problems, the present invention provides a thermoelectric element.

According to one embodiment, the thermoelectric element may include a first thermoelectric leg containing a two-dimensional electron gas (2DEG) generated between binary metal oxides different from each other, and a second thermoelectric leg containing two-dimensional hole gas (2DHG) generated between binary compounds different from each other, wherein the carrier density is proportional to a Seebeck coefficient.

According to one embodiment, the two-dimensional electron gas may be formed between a first material film containing a first binary metal oxide and a second material film containing a second binary metal oxide, and the two-dimensional hole gas may be formed between the material film containing a first binary compound and a fourth material film containing a second binary compound.

According to one embodiment, the first binary metal oxide may include at least one of titanium oxide ($TiO_2$), zinc oxide (ZnO), aluminum oxide ($Al_2O_3$), hafnium oxide (HfO), indium oxide (InO), gallium oxide (GaO), silicon oxide (SiO), tin oxide (SnO), vanadium oxide (VO), nickel oxide (NiO), tantalum oxide (TaO), neodymium oxide (NbO), or zirconium oxide (ZrO), and the second binary metal oxide may include at least one of titanium oxide ($TiO_2$), zinc oxide (ZnO), aluminum oxide ($Al_2O_3$), hafnium oxide (HfO), indium oxide (InO), gallium oxide (GaO), silicon oxide (SiO), tin oxide (SnO), vanadium oxide (VO), nickel oxide (NiO), tantalum oxide (TaO), neodymium oxide (NbO), or zirconium oxide (ZrO).

According to one embodiment, the first binary compound may include at least one of a copper oxide (CuO, $Cu_2O$, $Cu_4O_3$), tin oxide (SnO), zinc oxide (ZnO), nickel oxide (NiO), bismuth oxide ($Bi_2O_3$), cobalt oxide ($Co_3O_4$), manganese oxide ($Mn_3O_4$), or a lithium (Li)-doped oxide semiconductor, a sodium (Na)-doped oxide semiconductor, a strontium (Sr)-doped oxide semiconductor, a lanthanum (La)-doped oxide semiconductor, an aluminum (Al)-doped oxide semiconductor, and a nitrogen (N)-doped oxide semiconductor, and the second binary compound may include at least one of metal oxide, nitrogen (N)-containing oxide, nitrogen (N)-containing compound, nickel (Ni) ions, sodium (Na) ions, strontium (Sr) ions, lanthanum (La) ions, and aluminum (Al) ions.

According to one embodiment, the first thermoelectric leg may be used as an n-type semiconductor, and the second thermoelectric leg may be used as a p-type semiconductor.

According to one embodiment, the thermoelectric element may further include a first lower electrode on which the first thermoelectric leg is disposed, a second lower electrode on which the second thermoelectric leg is disposed, and an upper electrode for connecting one end of the first thermoelectric leg and one end of the second thermoelectric leg.

According to another embodiment, the thermoelectric element may include a first metal pad serving as a hot junction, a second metal pad serving as a cold junction, and a channel for connecting the first metal pad and the second metal pad, wherein the channel may include at least one of two-dimensional electron gas (2DEG) and two-dimensional hole gas (2DHG), in which the two-dimensional electron gas and the two-dimensional hole gas may have one side connected to the first metal pad and an opposite side connected to the second metal pad.

According to another embodiment, the channel may include a first material film containing a first binary metal oxide, and a second material film disposed on the first material film and containing a second binary metal oxide, in which the two-dimensional electron gas is generated between the first material film and the second material film.

According to another embodiment, in the thermoelectric element, the carrier density may be proportional to the Seebeck coefficient.

According to another embodiment, in the channel, the first material film and the second material film may be alternately and repeatedly laminated.

In order to solve the above technical problems, the present invention provides an active cooling apparatus.

According to one embodiment, the active cooling apparatus includes a substrate, first and second integrated circuit structures spaced apart from each other and disposed on the substrate, the thermoelectric element according to the embodiment, and a third metal pad serving as a thermal contact, wherein the first metal pad is disposed on the first integrated circuit structure, the third metal pad is disposed on the second integrated circuit structure, and the second metal pad is disposed between the first and second integrated circuit structures and on the substrate, and the channel electrically connects the first and second metal pads, and electrically connects the second and third metal pads.

According to one embodiment, heat generated from the first and second integrated circuit structures may be transferred to the first and third metal pads and then dissipated along the channel.

ADVANTAGEOUS EFFECTS

The preparation method for a thermoelectric composite according to the embodiment of the present invention includes the steps of: preparing a base substrate containing a first binary metal oxide (for example, ZnO or $TiO_2$); and providing a metal precursor and a reaction material containing oxygen (O) onto the base substrate to form a material film containing a second binary metal oxide (for example, $Al_2O_3$) resulting from reaction of the metal precursor and the reaction material, wherein the forming of the material film includes generating a 2-dimensional electron gas between the base substrate and the material film as the material film is formed on the base substrate.

In addition, the material film may be formed through an atomic layer deposition (ALD) process, and TMA and DMAIP may be used together as metal precursors. Accordingly, a sheet resistance can be reduced at an interface between the base substrate and the material film.

In addition, when the material film is formed through TMA, a functional film may be additionally formed on the material film. Accordingly, a functional structure can be manufactured in which the two-dimensional electron gas is generated between the base substrate and the material film, and the functional film (140) is disposed on the material film. The functional structure is applied to a semiconductor device, so that the characteristics of the semiconductor device can be improved.

In addition, the thermoelectric composite according to the embodiment of the present invention may be used as an n-type semiconductor of a thermoelectric element. In this case, the thermoelectric composite is formed through the atomic layer deposition (ALD) process, so as to be easily manufactured in the form of an ultra-thin film, so that the thermal conductivity of the thermoelectric element can be easily reduced.

In addition, the electrical conductivity of the thermoelectric element can be improved by the two-dimensional electron gas, and a multi-layer laminated structure may be easily manufactured by the atomic layer deposition (ALD) process, so that the electrical conductivity can be easily improved.

In addition, unlike the conventional thermoelectric element in which the carrier density and the Seebeck coefficient are inversely proportional, the unique characteristic in which the carrier density and the Seebeck coefficient are proportional can be expressed.

DETAILED DESCRIPTION

Hereinafter, exemplary embodiments of the present invention will be described in detail with reference to the accompanying drawings. However, the technical idea of the present invention is not limited to the exemplary embodiments described herein and may be embodied in other forms. Further, the embodiments are provided to enable contents disclosed herein to be thorough and complete and provided to enable those skilled in the art to fully understand the idea of the present invention.

In the specification herein, when one component is mentioned as being on another component, it signifies that the one component may be placed directly on the another component or a third component may be interposed therebetween. In addition, in drawings, thicknesses of layers and areas may be exaggerated to effectively describe the technology of the present invention.

In addition, although terms such as first, second and third are used to describe various components in various embodiments of the present specification, the components should not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination therefore recited in the specification, and does not preclude the possibility of the presence or addition of one or more other features, numbers, steps, components, or combinations therefore. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

Figure 1:
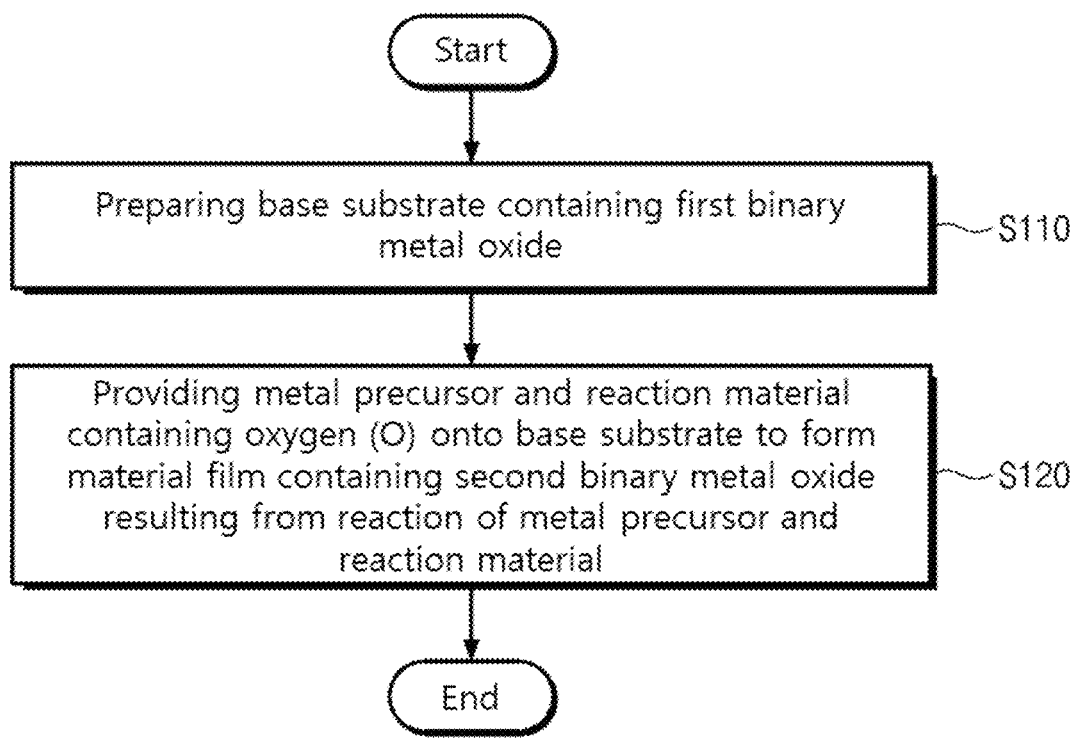
FIG. 1 is a flowchart explaining a preparation method for a thermoelectric composite according to the embodiment of the present invention.
Figure 2:
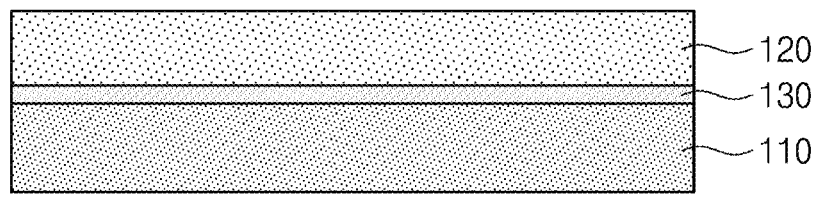
FIG. 2 is a view showing the thermoelectric composite according to the embodiment of the present invention.
Figure 3:
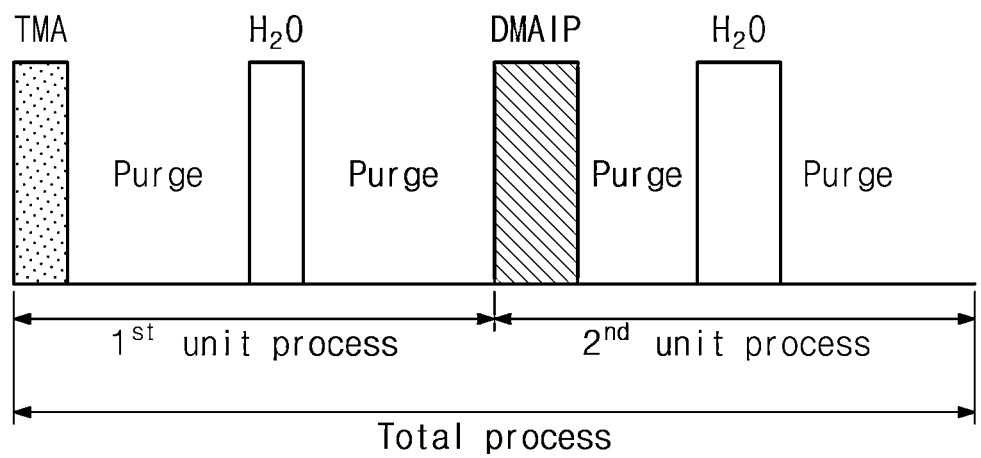
FIG. 3 is a view for explaining in detail a material film preparation process in the preparation method for the thermoelectric composite according to the embodiment of the present invention.
Figure 4:
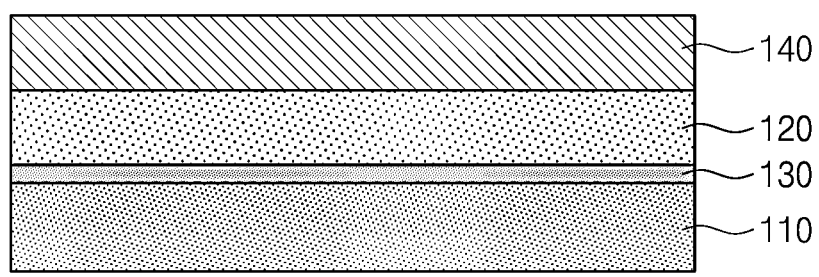
FIG. 4 is a view showing a state in which a functional film is additionally formed on a material film of the thermoelectric composite according to the embodiment of the present invention.

FIG. 1 is a flow chart for explaining a preparation method for a thermoelectric composite according to the embodiment of the present invention. FIG. 2 is a view showing the thermoelectric composite according to the embodiment of the present invention. FIG. 3 is a view for specifically explaining a material film manufacturing process in the preparation method of the thermoelectric composite according to the embodiment of the present invention. FIG. 4 is a view showing a state in which a functional film is additionally formed on a material film of the thermoelectric composite according to the embodiment of the present invention.

Referring to FIGS. 1 and 2, a base substrate 110 including a first binary metal oxide may be prepared (S110). According to one embodiment, the first binary metal oxide may include any one of titanium oxide ($TiO_2$), zinc oxide (ZnO), aluminum oxide ($Al_2O_3$), hafnium oxide (HfO), indium oxide (InO), gallium oxide (GaO), silicon oxide (SiO), tin oxide (SnO), vanadium oxide (VO), nickel oxide (NiO), tantalum oxide (TaO), neodymium oxide (NbO), or zirconium oxide (ZrO).

A material film 120 containing a second binary metal oxide may be formed on the base substrate 110 (S120). According to one embodiment, the second binary metal oxide may include any one of titanium oxide ($TiO_2$), zinc oxide (ZnO), aluminum oxide ($Al_2O_3$), hafnium oxide (HfO), indium oxide (InO), gallium oxide (GaO), silicon oxide (SiO), tin oxide (SnO), vanadium oxide (VO), nickel oxide (NiO), tantalum oxide (TaO), neodymium oxide (NbO), or zirconium oxide (ZrO). Hereinafter, the case in which the second binary metal oxide includes aluminum oxide ($Al_2O_3$) will be described.

The material film 120 may be formed through an atomic layer deposition process. Specifically, the step of forming the material film 120 may include: providing a metal precursor on the base substrate 110; and providing a reaction material on the base substrate 110 provided with the metal precursor. In addition, the step of forming the material film 120 may further include: purge steps between the step of providing the metal precursor and the step of providing the reaction material, and after the step of providing the reaction material. In other words, the material film 120 may be formed through the step of providing the metal precursor, the purge step, the step of providing the reaction material, and the purge step.

When the material film 120 containing the second binary metal oxide is formed on the base substrate 110 containing the first binary metal oxide, two-dimensional electron gas (2DEG) 130 may be generated between the base substrate 110 and the material film 120. According to one embodiment, the generation of the two-dimensional electron gas 130 may be controlled according to a type of the metal precursor and a type of the reaction material. In other words, whether the two-dimensional electron gas 130 is generated may be controlled according to the type of metal precursor and the type of reaction material used in the process of forming the material film 120.

Specifically, trimethylaluminum (TMA) may be used as the metal precursor, and water ($H_2O$) may be used as the reaction material. In this case, the two-dimensional electron gas 130 may be generated between the base substrate 110 and the material film 120. On the contrary, when dimethylaluminumisopropoxide (DMAIP) is used as the metal precursor, the two-dimensional electron gas 130 may not be generated between the base substrate 110 and the material film 120. In addition, when ozone ($O_3$) or oxygen plasma ($O_2$ plasma) is used as the reaction material, the two-dimensional electron gas 130 may not be generated due to excessive oxidizing power.

In addition, according to one embodiment as shown in FIG. 3, the step of forming the material film 120 includes providing a first metal precursor and a reaction material onto the base substrate 110; and providing a second metal precursor and a reaction material onto the base substrate 110, wherein the step of providing the first metal precursor and the reaction material may be performed before the step of providing the second metal precursor and the reaction material. For example, the first metal precursor may include trimethylaluminum (TMA), and the second metal precursor may include dimethylaluminumisopropoxide (DMAIP). In other words, the material film 120 is formed through different metal precursors (for example, TMA and DMAIP), in which the provision of TMA may be performed prior to the provision of DMAIP. On the contrary, when the provision of DMAIP is performed prior to the provision of TMA, a problem may occur in that the two-dimensional electron gas 130 is not generated between the base substrate 110 and the material film 120.

According to one embodiment, the step of providing the first metal precursor (for example, TMA) and the reaction material (for example, $H_2O$) may be defined as a first unit process (1st unit process), and the step of providing the second metal precursor (for example, DMAIP) and the reaction material (for example, $H_2O$) may be defined as a second unit process (2nd unit process). Each of the first unit process and the second unit process may be repeated multiple times.

When the material film 120 is formed by sequentially providing the first metal precursor (for example, TMA) and the second metal precursor (for example, DMAIP), a sheet resistance at an interface between the base substrate 110 and the material film 120 may be reduced compared to the case in which the material film 120 is formed by providing only the first metal precursor (for example, TMA). Accordingly, the semiconductor device containing the two-dimensional electron gas 130 generated by the material film 120 formed by sequentially providing the first metal precursor (for example, TMA) and the second metal precursor (for example, DMAIP) may have the electrical properties further improved compared to the semiconductor device containing the two-dimensional electron gas 130 generated by the material film 120 formed by providing only the first metal precursor (for example, TMA).

Referring to FIG. 4, after the material film 120 is formed by the atomic layer deposition process (ALD) through TMA, a functional film 140 may be further formed on the material film 120. Accordingly, the two-dimensional electron gas 130 may be generated between the base substrate 110 and the material film 120, and a functional structure may be manufactured in which the functional film 140 is disposed on the material film 120.

The functional structure may be applied to a semiconductor device, so that the characteristics of the semiconductor device can be improved. For example, when the functional structure is applied to a transistor, the electrical properties can be improved through the two-dimensional electron gas, and the additional properties can be improved through the functional film 140. For example, when a silicon oxide ($SiO_2$) film is used as the functional film 140, the transistor to which the functional structure is applied can have the improved electrical properties through the two-dimensional electron gas, and have the current leakage prevention effect by the functional film (for example, $SiO_2$). In addition, when a hafnium oxide ($HfO_2$) film is used as the functional film 140, the transistor to which the functional structure is applied can have the improved electrical properties through the two-dimensional electron gas, and express the high dielectric properties by the functional film (for example, $HfO_2$).

As a result, in the preparation method for the thermoelectric composite according to the embodiment of the present invention, the material film 120 is formed on the base substrate 110 through the atomic layer deposition (ALD) process, in which TMA may be used as the metal precursor used for forming the material film 120. Accordingly, the two-dimensional electron gas 130 may be generated between the base substrate 110 and the material film 120.

In addition, not only TMA but also DMAIP may be used together as the metal precursor used for framing the material film 120, so that the sheet resistance at the interface between the base substrate 110 and the material film 120 may be reduced.

In addition, when the material film 120 is formed through TMA, the functional film 140 may be additionally formed on the material film 120. Accordingly, the two-dimensional electron gas 130 may be generated between the base substrate 110 and the material film 120, and a functional structure may be manufactured in which the functional film 140 is disposed on the material film 120. The functional structure is applied to a semiconductor device, so that the characteristics of the semiconductor device can be improved.

Figure 5:
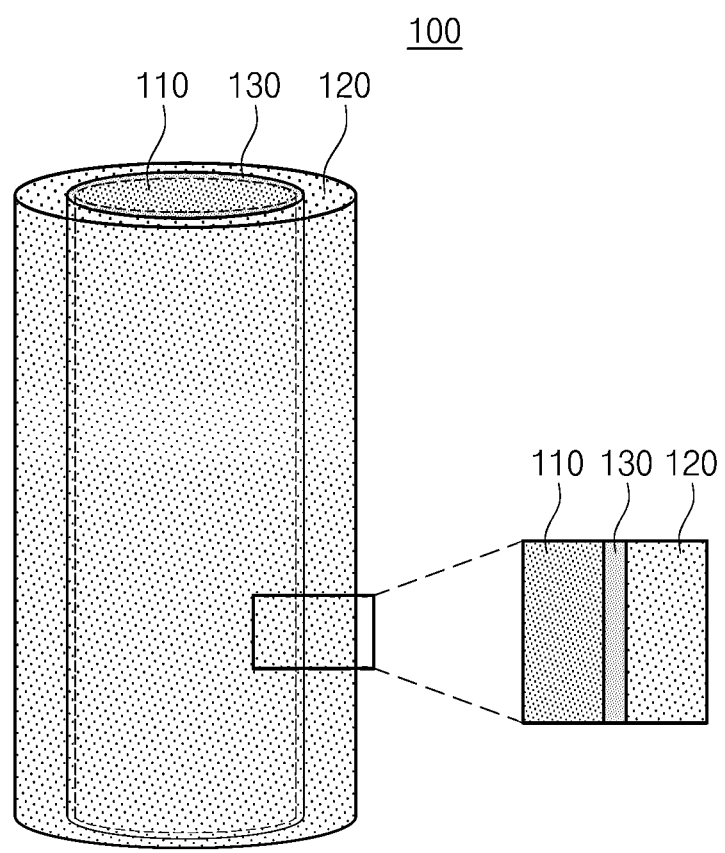
FIG. 5 is a view for explaining a structure of the thermoelectric composite according to the first embodiment of the present invention.
Figure 6:
FIG. 6 is a view for explaining a structure of the thermoelectric composite according to a second embodiment of the present invention.
Figure 7:
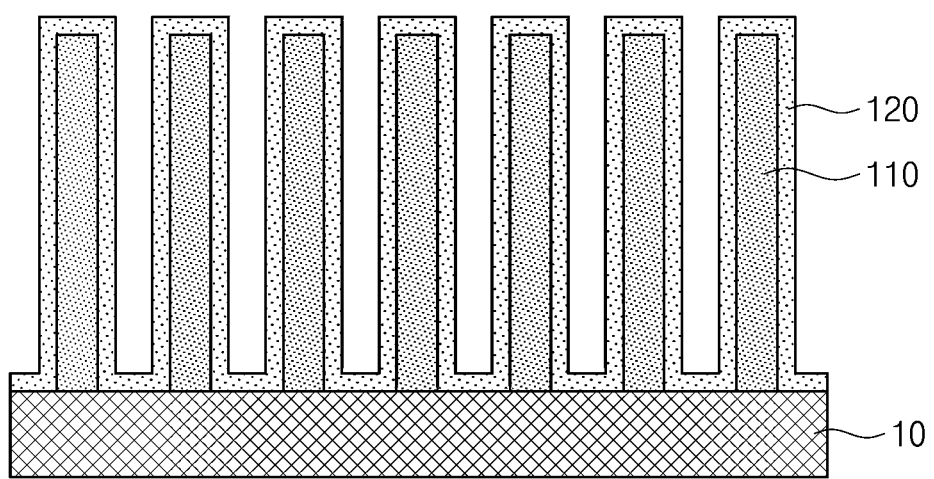
FIG. 7 is a view for explaining a structure of the thermoelectric composite according to a third embodiment of the present invention.
Figure 8:
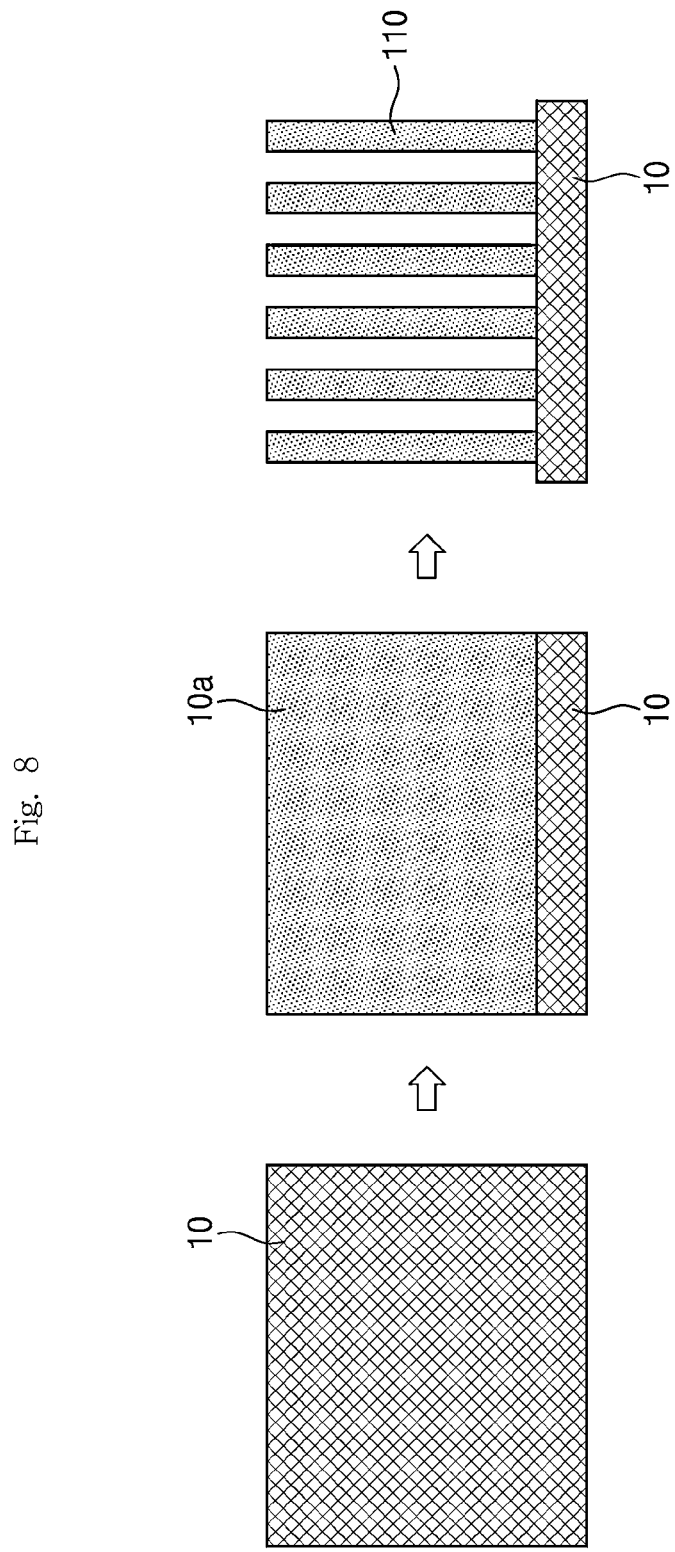
FIG. 8 is a view for explaining a process of manufacturing a structure of the thermoelectric composite according to a third embodiment of the present invention.
Figure 9:
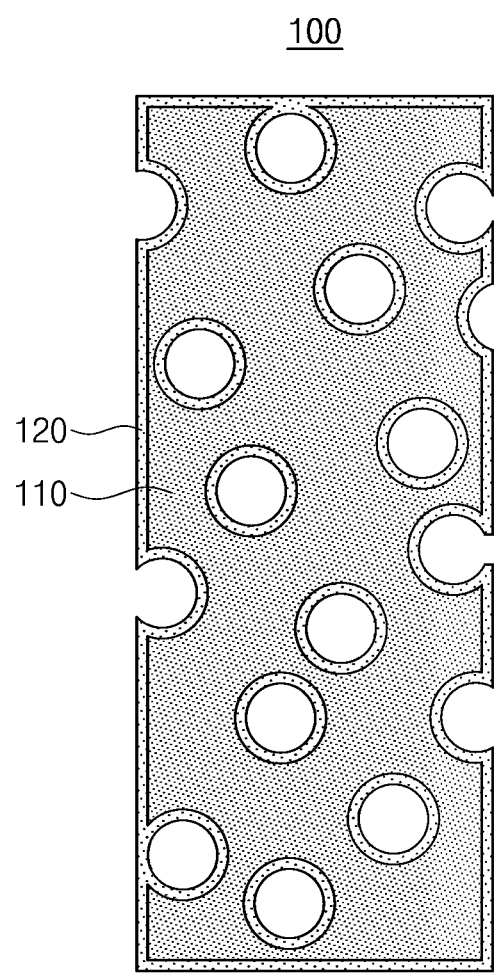
FIG. 9 is a view for explaining a structure of the thermoelectric composite according to a fourth embodiment of the present invention.

FIG. 5 is a view for explaining a structure of the thermoelectric composite according to the first embodiment of the present invention. FIG. 6 is a view for explaining a structure of the thermoelectric composite according to a second embodiment of the present invention. FIG. 7 is a view for explaining a structure of the thermoelectric composite according to a third embodiment of the present invention. FIG. 8 is a view for explaining a process of manufacturing a structure of the thermoelectric composite according to a third embodiment of the present invention. FIG. 9 is a view for explaining a structure of the thermoelectric composite according to a fourth embodiment of the present invention.

Referring to FIGS. 5 to 9, the thermoelectric composite according to the embodiment of the present invention may have various structures. In other words, the thermoelectric composite according to the embodiment of the present invention includes the base substrate 110 containing the first binary metal oxide (for example, ZnO or $TiO_2$), the material film 120 containing the second binary metal oxide (for example, $Al_2O_3$), and the two-dimensional electron gas 130 generated between the base substrate 110 and the material film 120, so as to have various structures.

More specifically, referring to FIG. 5, the thermoelectric composite 100 according to the first embodiment of the present invention may include the base substrate 110 in the shape of a nano wire, the material film 120 surrounding a surface of the base substrate 110, and the two-dimensional electron gas 130 generated between the base substrate 110 and the material film 120.

Referring to FIG. 6, the thermoelectric composite 100 according to the second embodiment may include the base substrate 110 in the shape of a nano wire, and first material films 120 and second material films 150 alternately formed on the base substrate 110. According to one embodiment, the first material film 120 may include the second binary metal oxide (for example, $Al_2O_3$). On the contrary, the second material film 150 may include the first binary metal oxide (for example, ZnO or $TiO_2$). Accordingly, the two-dimensional electron gas (not shown) may be generated between the base substrate 110 and the first material film 120, and the two-dimensional electron gas (not shown) may be generated between the first material film 120 and the second material film 150.

Referring to FIG. 7, the thermoelectric composite 100 according to a third embodiment may have a structure in which a metal substrate is integrated with a thermoelectric material. Specifically, the thermoelectric composite 100 according to the third embodiment includes a metal substrate 10; a plurality of base substrates 110 formed on the metal substrate 10; a material film 120 formed along a surface profile of the base substrates 110 to cover the base substrates 110; and two-dimensional electron gas (not shown) generated between the base substrate 110 and the material film 120, wherein the base substrate 110 may have a nano rod shape.

According to one embodiment as shown in FIG. 8, the base substrates 110 having a nano rod shape may be formed by preparing and then etching the metal substrate 10 to reduce a thickness, growing a metal oxide layer 10*a* on the metal substrate 10 having the reduced thickness, and chemically etching the grown metal oxide layer 10*a*.

Referring to FIG. 9, the thermoelectric composite 100 according to the fourth embodiment may include the base substrate 110 having a porous structure, a material film 120 formed on the base substrate 110, and two-dimensional electron gas (not shown) generated between the base substrate 110 and the material film 120.

Figure 10:
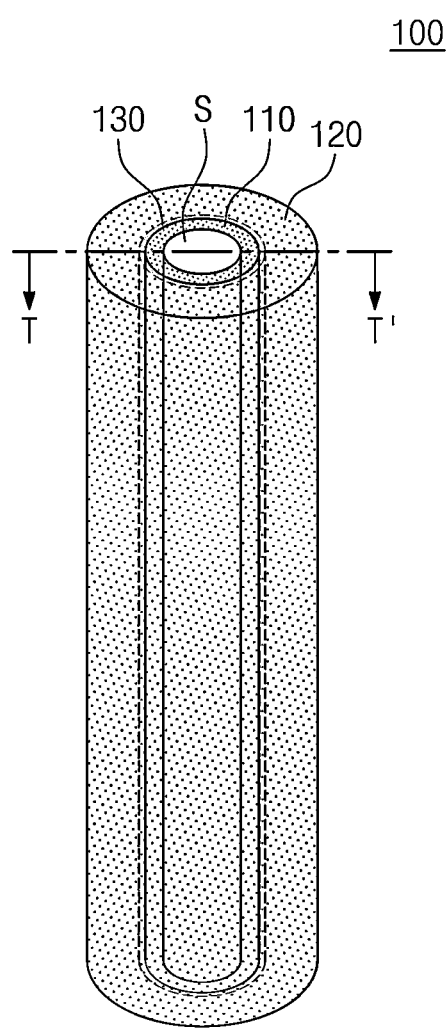
FIG. 10 is a view for explaining a structure of the thermoelectric composite according to the first modification of the present invention.
Figure 11:
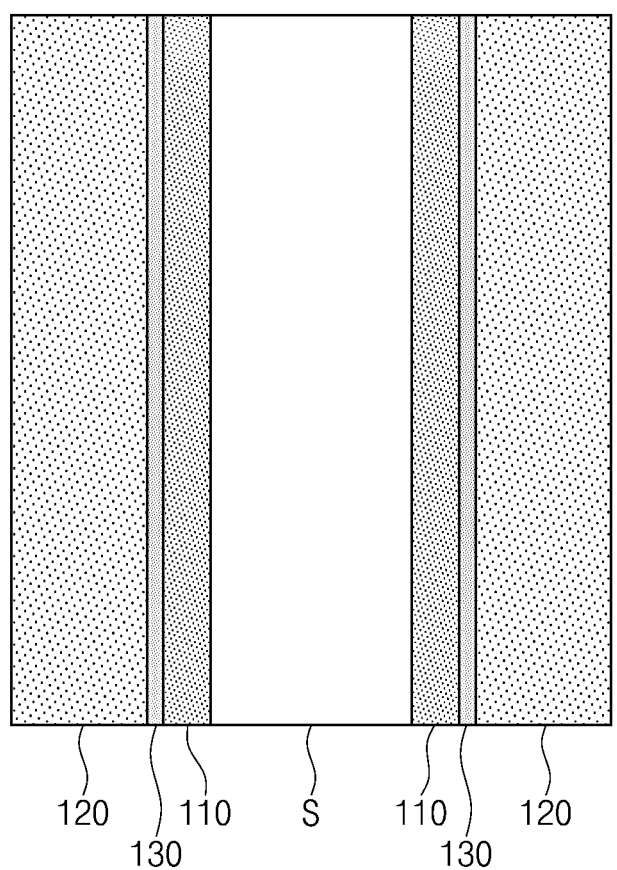
FIG. 11 is a sectional view taken along line T-T' of FIG. 10.
Figure 12:
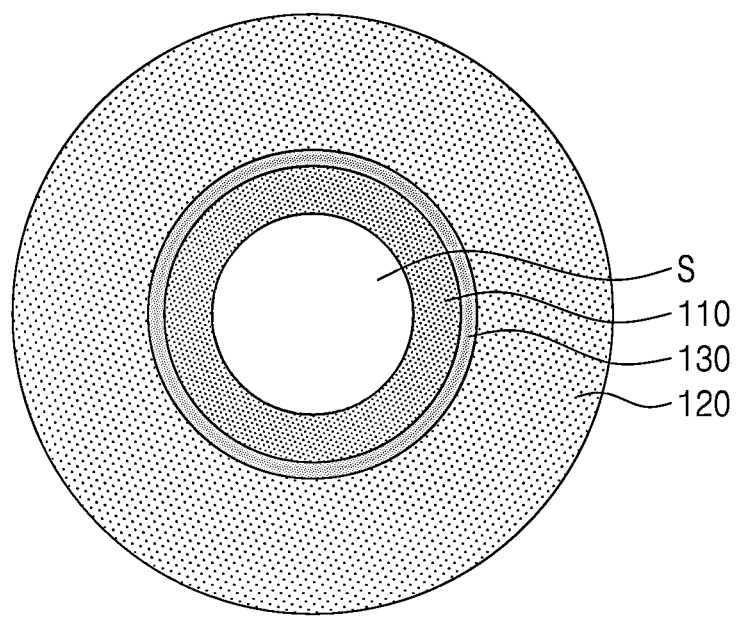
FIG. 12 is a view for explaining a structure of the thermoelectric composite according to the second modification of the present invention.

FIG. 10 is a view for explaining a structure of the thermoelectric composite according to the first modification of the present invention. FIG. 11 is a sectional view taken along line T-T' of FIG. 10. FIG. 12 is a view for explaining a structure of the thermoelectric composite according to the second modification of the present invention.

Referring to FIGS. 10 and 11, the thermoelectric composite 100 according to the first modification may include a base nanowire S; a first material film 110 formed on the base nanowire S; a second material film 120 formed on the first material film 110; and two-dimensional electron gas 130 generated between the first material film 110 and the second material film 120. According to one embodiment, the base nanowire S may include a thermoelectric material. For example, the thermoelectric material may include bismuth (Bi) and tellurium (Te). Specifically, the thermoelectric material may include $Bi_2Te_3$. In addition, the first material film 110 may include the first binary metal oxide (for example, ZnO or $TiO_2$), and the second material film 120 may include the second binary metal oxide (for example, $Al_2O_3$).

Referring to FIG. 12, the thermoelectric composite 100 according to the second modification may include thermoelectric particles S, a first material film 110 covering the thermoelectric particles S, a second material film 120 covering the first material film 110, and two-dimensional electron gas 130 generated between the first material film 110 and the second material film 120. According to one embodiment, the thermoelectric particle S may include a thermoelectric material. For example, the thermoelectric material may include bismuth (Bi) and tellurium (Te). Specifically, the thermoelectric material may include $Bi_2Te_3$. In addition, the first material film 110 may include the first binary metal oxide (for example, ZnO or $TiO_2$), and the second material film 120 may include the second binary metal oxide (for example, $Al_2O_3$).

The thermoelectric composites according to the embodiments and the modifications of the present invention have been described. Hereinafter, the thermoelectric element according to the embodiment of the present invention will be described.

Figure 13:
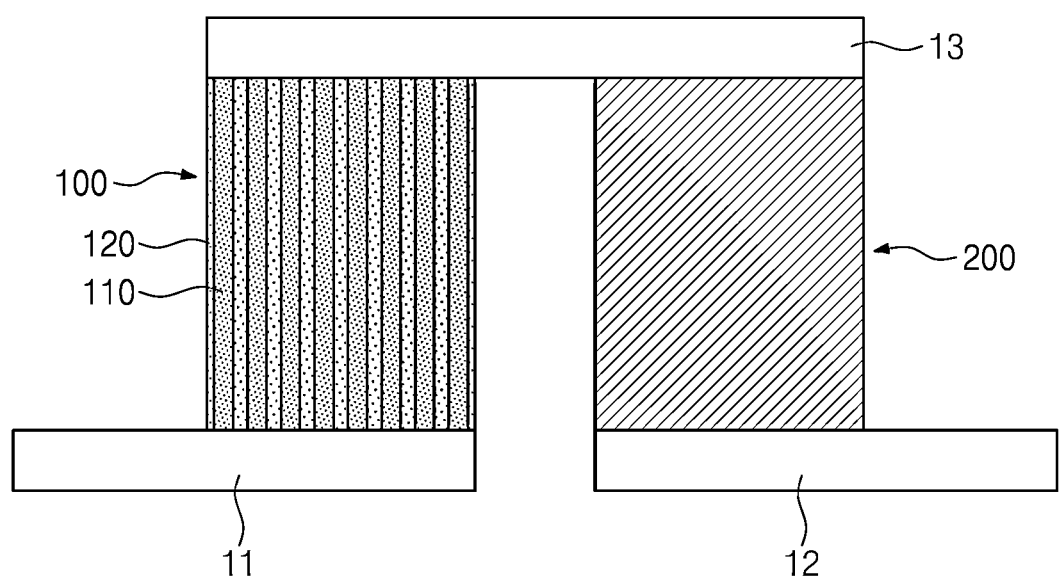
FIG. 13 is a view for explaining the thermoelectric element according to the first embodiment of the present invention.
Figure 14:
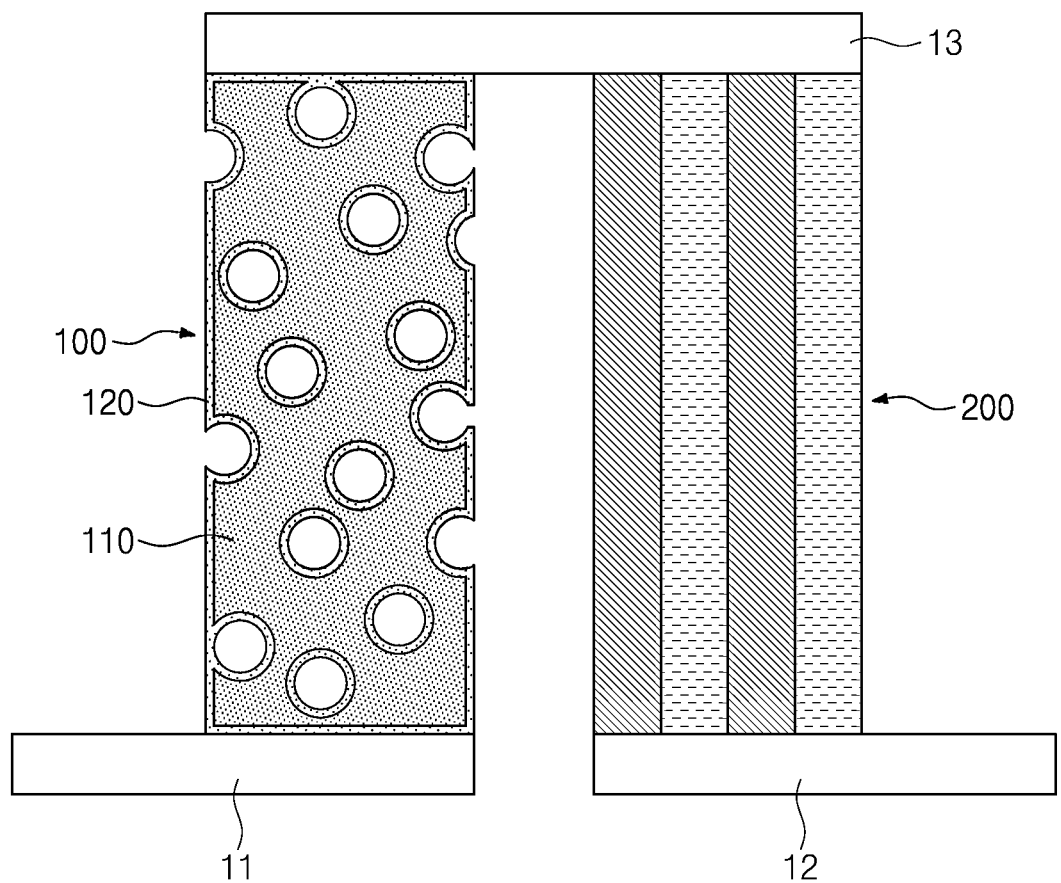
FIG. 14 is a view for explaining the thermoelectric element according to a second embodiment of the present invention.

FIG. 13 is a view for explaining the thermoelectric element according to the first embodiment of the present invention. FIG. 14 is a view for explaining the thermoelectric element according to a second embodiment of the present invention.

Referring to FIGS. 13 and 14, the thermoelectric element TE according to the first and second embodiments may include a first lower electrode 11, a second lower electrode 12, an upper electrode 13, a first thermoelectric leg 100, and a second thermoelectric leg 200.

More specifically, the first lower electrode 11 and the second lower electrode 12 may be spaced apart from each other, in which the first thermoelectric leg 100 may be disposed on the first lower electrode 11, and the second thermoelectric leg 200 may be disposed on the second lower electrode 12. In addition, one end of the first thermoelectric leg 100 may be connected to one end of the second thermoelectric leg 200 through the upper electrode 13.

According to one embodiment, the first thermoelectric leg 100 may include the thermoelectric composite according to the embodiment described with reference to FIGS. 1 and 2. In other words, the first thermoelectric leg 100 may include the base substrate 110 containing the first binary metal oxide (for example, ZnO or $TiO_2$), the material film 120 containing the second binary metal oxide (for example, $Al_2O_3$), and the two-dimensional electron gas (not shown) generated between the base substrate 110 and the material film 120. The first thermoelectric leg 100 may be applied as an n-type semiconductor. On the contrary, the second thermoelectric leg 200 may include a bulk semiconductor and may be applied as a p-type semiconductor.

The thermoelectric element TE according to the first embodiment and the thermoelectric element TE according to the second embodiment may have a different thermoelectric composite constituting the first thermoelectric leg 100. For example, as shown in FIG. 13, the thermoelectric element TE according to the first embodiment may have a structure in which the base substrates 110 and the material films 120 are alternately and repeatedly laminated. On the contrary, as shown in FIG. 14, the thermoelectric element TE according to the second embodiment may have a porous structure.

In the thermoelectric element TE according to the embodiment, the sheet resistance and the carrier density at the interface between the base substrate 110 and the material film 120 may be controlled by controlling the process temperature for forming the material film 120 of the thermoelectric composite. In addition, in the thermoelectric element TE according to the embodiment, the Seebeck coefficient may be controlled by controlling the carrier density at the interface between the base substrate 110 and the material film 120. In other words, in the thermoelectric element according to the embodiment, the Seebeck coefficient of the thermoelectric element may be controlled by controlling the process temperature for foiling the material film 120.

Specifically, as the temperature of the process for forming the material film 120 is increased, the sheet resistance at the interface between the base substrate 110 and the material film 120 may be reduced. However, when the process temperature for forming the material film 120 exceeds 100° C., the sheet resistance at the interface between the base substrate 110 and the material film 120 may be substantially saturated. In addition, as the temperature of the process for forming the material film 120 is increased, the carrier density at the interface between the base substrate 110 and the material film 120 may be increased. When the carrier density at the interface between the base substrate 110 and the material film 120 is increased, the Seebeck coefficient of the thermoelectric element may be increased. In other words, in the thermoelectric element according to the embodiment, as the temperature of the process for forming the material film 120 is increased, the Seebeck coefficient of the thermoelectric element TE may be increased.

The conventional thermoelectric element using $Bi_2Te_3$ as an N-type semiconductor is doped with separate materials to reduce the thermal conductivity or increase the electrical conductivity. However, since the physical properties of the material itself are fixed, the above doping technology has a limit in reducing the thermal conductivity and increasing the electrical conductivity. Accordingly, the conventional thermoelectric element has difficulty in scaling-up due to low thermoelectric properties, and has high power consumption and low power production efficiency.

However, the thermoelectric element TE according to the embodiment of the present invention may have not only low thermal conductivity properties but also high electrical conductivity properties, due to the first thermoelectric leg 100 including the thermoelectric composite. Specifically, the thermoelectric composite used as the first thermoelectric leg 100 is formed through the atomic layer deposition (ALD) process, so that the thermoelectric element TE according to the embodiment may be easily manufactured in the form of an ultra-thin film. Accordingly, in the thermoelectric element TE according to the embodiment, the thermal conductivity can be easily reduced.

In addition, in the thermoelectric element TE according to the embodiment, the electrical conductivity can be improved due to the two-dimensional electron gas contained in the thermoelectric composite. In addition, the multi-layer laminated structure of the thermoelectric composite (the alternating layered structure of the base substrate and the material film) may be easily manufactured, so that the electrical conductivity properties can be easily improved.

In addition, unlike the conventional thermoelectric element in which the carrier density and the Seebeck coefficient are inversely proportional, the unique characteristic in which the carrier density and the Seebeck coefficient are proportional can be expressed.

Figure 15:
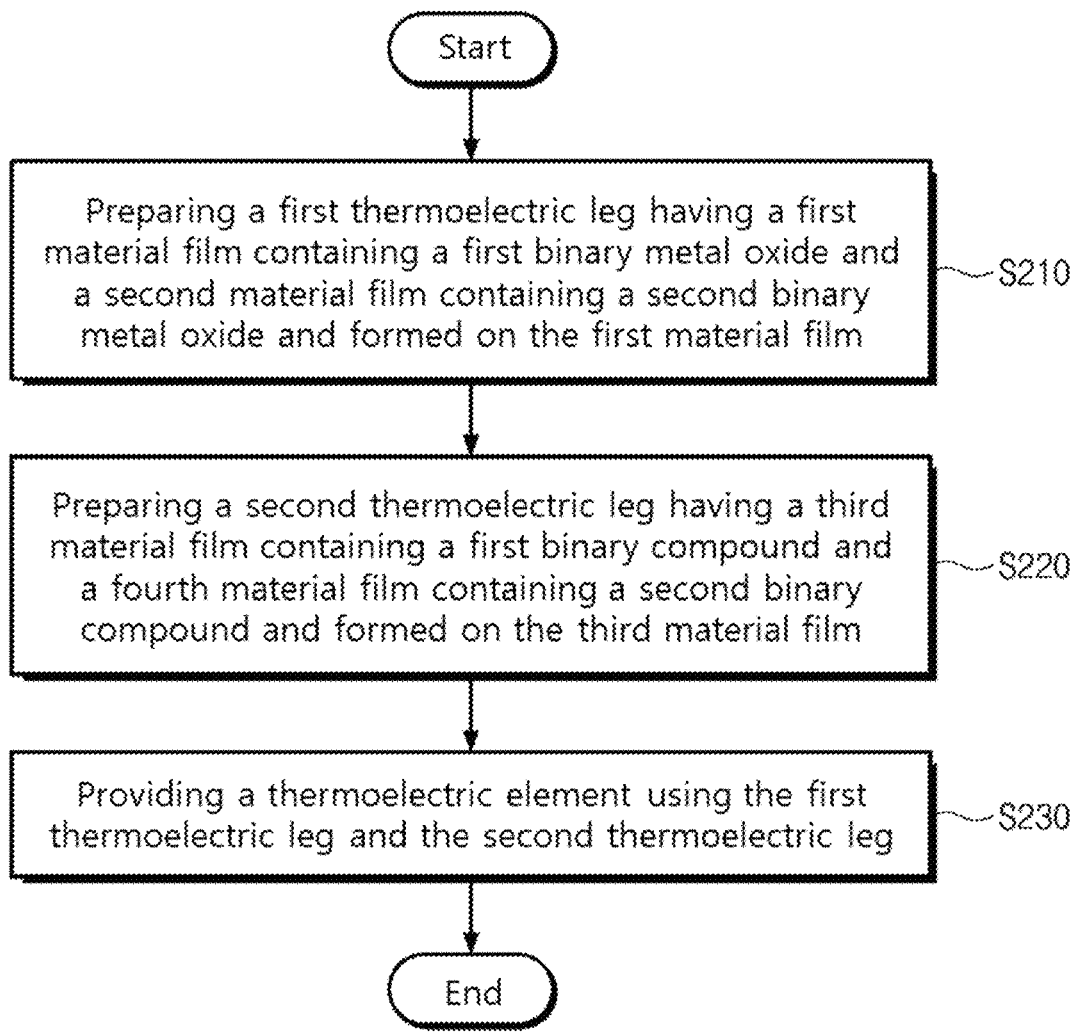
FIG. 15 is a flow chart for explaining a preparation method for the thermoelectric element according to a third embodiment of the present invention.
Figure 16:
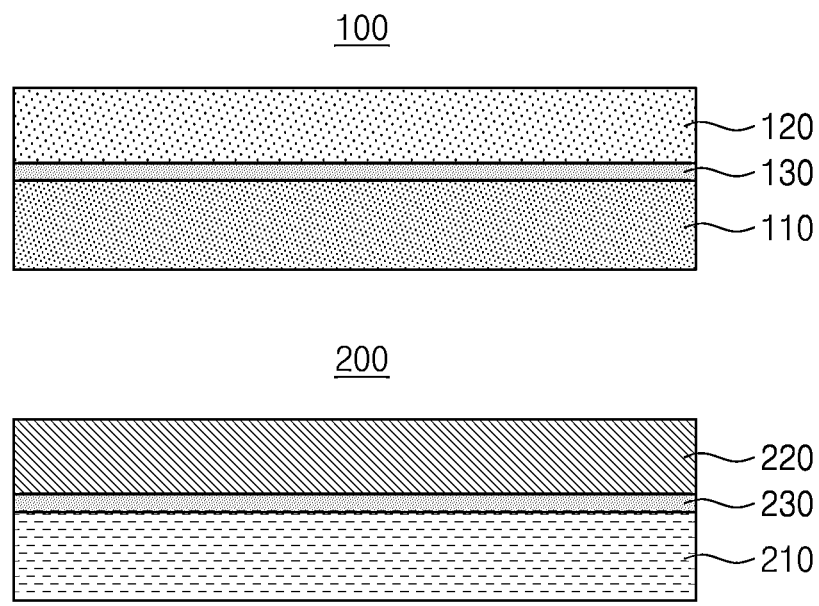
FIG. 16 is a view for explaining first and second thermoelectric legs included in the thermoelectric element according to a third embodiment of the present invention.
Figure 17:
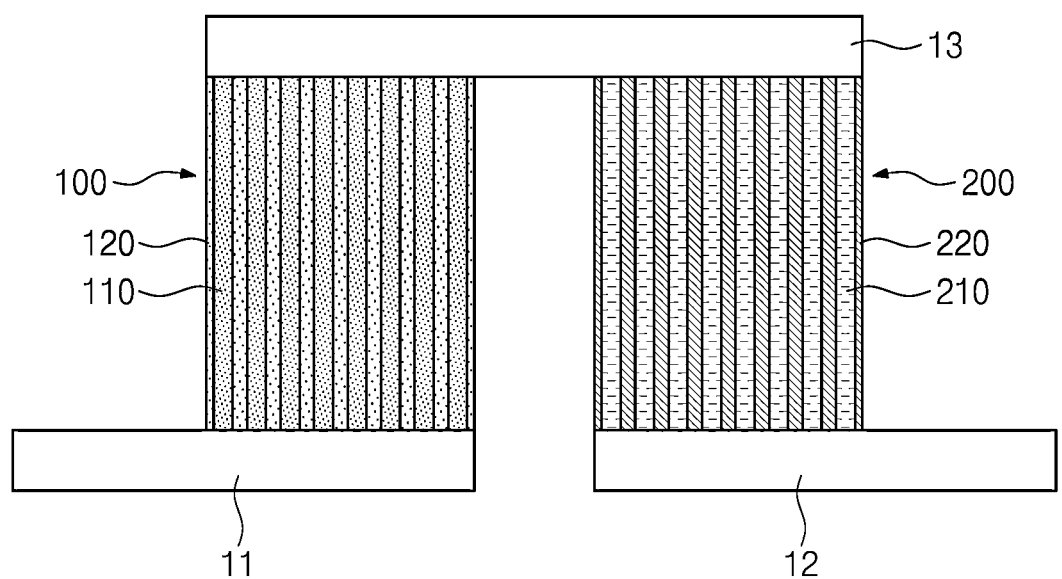
FIG. 17 is a view for explaining the thermoelectric element according to a third embodiment of the present invention.
Figure 18:
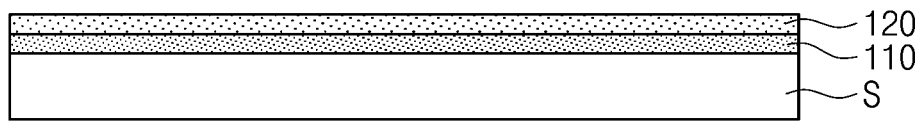
FIG. 18 is a view for explaining first and second thermoelectric structures included in the thermoelectric element according to a fourth embodiment of the present invention.
Figure 18:
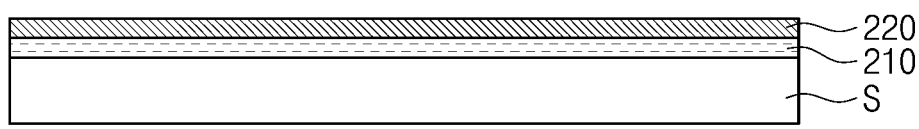
Figure 19:
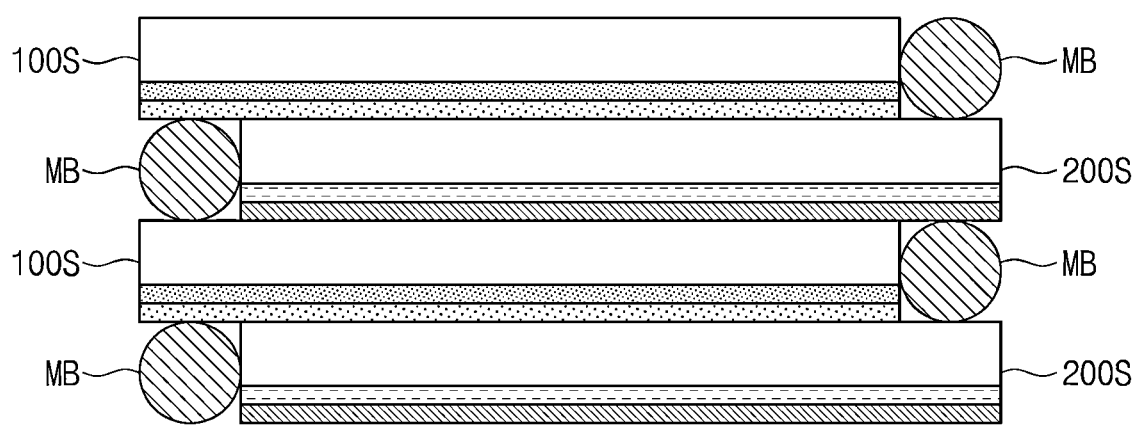
FIG. 19 is a view for explaining the thermoelectric element according to a fourth embodiment of the present invention.

FIG. 15 is a flow chart for explaining a preparation method for the thermoelectric element according to a third embodiment of the present invention. FIG. 16 is a view for explaining first and second thermoelectric legs included in the thermoelectric element according to a third embodiment of the present invention. FIG. 17 is a view for explaining the thermoelectric element according to a third embodiment of the present invention. FIG. 18 is a view for explaining first and second thermoelectric structures included in the thermoelectric element according to a fourth embodiment of the present invention. FIG. 19 is a view for explaining the thermoelectric element according to a fourth embodiment of the present invention.

Referring to FIGS. 15 to 17, the preparation method for the thermoelectric element according to a third embodiment of the present invention may include: preparing a first thermoelectric leg 100 having a first material film 110 containing a first binary metal oxide and a second material film 120 containing a second binary metal oxide and formed on the first material film 110 (S210); preparing a second thermoelectric leg 200 having a third material film 210 containing a first binary compound and a fourth material film 220 containing a second binary compound and formed on the third material film 210 (S220); and manufacturing a thermoelectric element TE using the first thermoelectric leg 100 and the second thermoelectric leg 200 (S230).

According to one embodiment, the first binary metal oxide and the second binary metal oxide may be the same as the first binary metal oxide and the second binary metal oxide included in the thermoelectric composite described with reference to FIG. 2. Accordingly, the two-dimensional electron gas 130 may be generated between the first material film 110 and the second material film 120. The method of generating the two-dimensional electron gas 130 may be the same as the method of generating the two-dimensional electron gas 130 described with reference to FIG. 2.

According to one embodiment, the first binary compound may include any one of a copper oxide (CuO, $Cu_2O$, $Cu_4O_3$), tin oxide (SnO), zinc oxide (ZnO), nickel oxide (NiO), bismuth oxide ($Bi_2O_3$), cobalt oxide ($Co_3O_4$), manganese oxide ($Mn_3O_4$), or a lithium (Li)-doped oxide semiconductor, a sodium (Na)-doped oxide semiconductor, a strontium (Sr)-doped oxide semiconductor, a lanthanum (La)-doped oxide semiconductor, an aluminum (Al)-doped oxide semiconductor, and a nitrogen (N)-doped oxide semiconductor. On the contrary, the second binary compound may include any one of metal oxide, nitrogen (N)-containing oxide, nitrogen (N)-containing compound, nickel (Ni) ions, sodium (Na) ions, strontium (Sr) ions, lanthanum (La) ions, and aluminum (Al) ions.

When the fourth material film 220 containing the second binary compound is formed on the third material film 210 containing the first binary compound, two-dimensional hole gas (2DHG) 230 may be generated between the third material film 210 and the fourth material film 220.

As shown in FIG. 17, the thermoelectric element TE according to the third embodiment may include a first lower electrode 11, a second lower electrode 12, an upper electrode 13, a first thermoelectric leg 100, and a second thermoelectric leg 200.

The first lower electrode 11 and the second lower electrode 12 may be spaced apart from each other, in which the first thermoelectric leg 100 may be disposed on the first lower electrode 11, and the second thermoelectric leg 200 may be disposed on the second lower electrode 12. In addition, one end of the first thermoelectric leg 100 may be connected to one end of the second thermoelectric leg 200 through the upper electrode 13.

According to one embodiment, the first thermoelectric leg 100 may be the same as the first thermoelectric leg 100 described with reference to FIG. 16. In other words, the first thermoelectric leg 100 may include the first material film 110 containing the first binary metal oxide (for example, ZnO); the second material film 120 containing the second binary metal oxide (for example, $Al_2O_3$); and the two-dimensional electron gas (not shown) generated between the first material film 110 and the second material film 120. The first thermoelectric leg 100 may be applied as an n-type semiconductor.

On the contrary, the second thermoelectric leg 200 may be the same as the second thermoelectric leg 200 described with reference to FIG. 16. In other words, the second thermoelectric leg 200 may include the third material film 210 containing the first binary compound; the fourth material film 220 containing the second binary compound; and the two-dimensional hole gas (not shown) generated between the third material film 210 and the fourth material film 220. The second thermoelectric leg 200 may be applied as a p-type semiconductor.

Referring to FIGS. 18 and 19, the thermoelectric element TE according to the fourth embodiment may include a first thermoelectric structure 100s, a second thermoelectric structures 200s, and a metal bead MB for connecting the first thermoelectric structure 100s to the second thermoelectric structure 200s, so as to have a structure in which the first thermoelectric structure 100s and the second thermoelectric structure 200s are alternately and repeatedly laminated.

According to one embodiment, the first thermoelectric structure 100s may include a base material (S), a first material film 110 formed on the base substrate S, and a second material film 120 formed on the first material film 110. On the contrary, the second thermoelectric structure 200s may include a base material (S), a third material film 210 formed on the base substrate S, and a fourth material film 220 formed on the third material film 210. The first to fourth material films 110, 120, 210, and 220 may be the same as the first to fourth material films 110, 120, 210, and 220 described with reference to FIG. 16. Accordingly, the first thermoelectric structure 100s may include two-dimensional electron gas (not shown) generated between the first material film 110 and the second material film 120. On the contrary, the second thermoelectric structure 200s may include two-dimensional hole gas (not shown) generated between the third material film 210 and the fourth material film 220.

Figure 20:
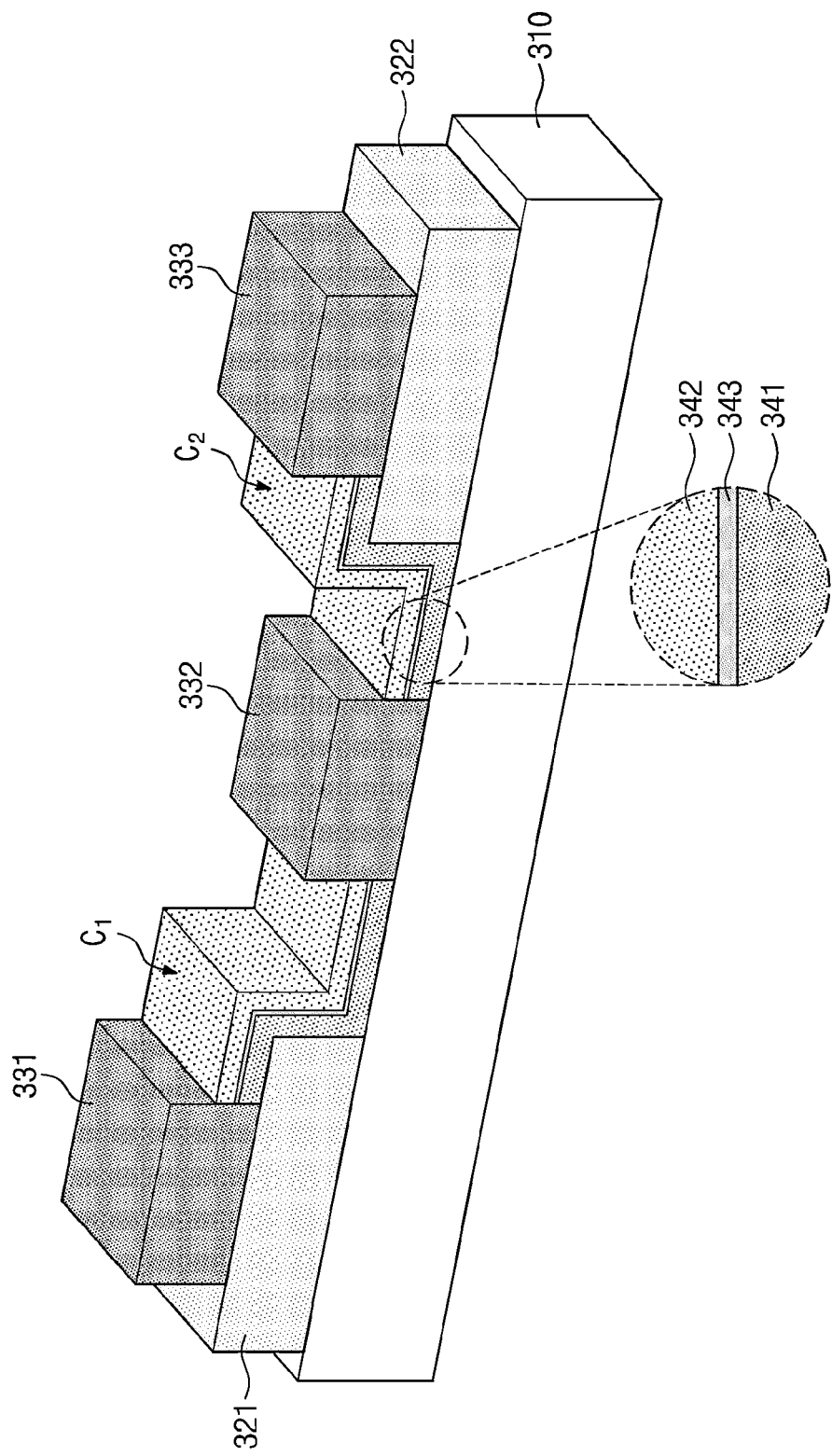
FIGS. 20 and 21 are perspective views of an active cooling apparatus according to the first embodiment of the present invention.
Figure 21:
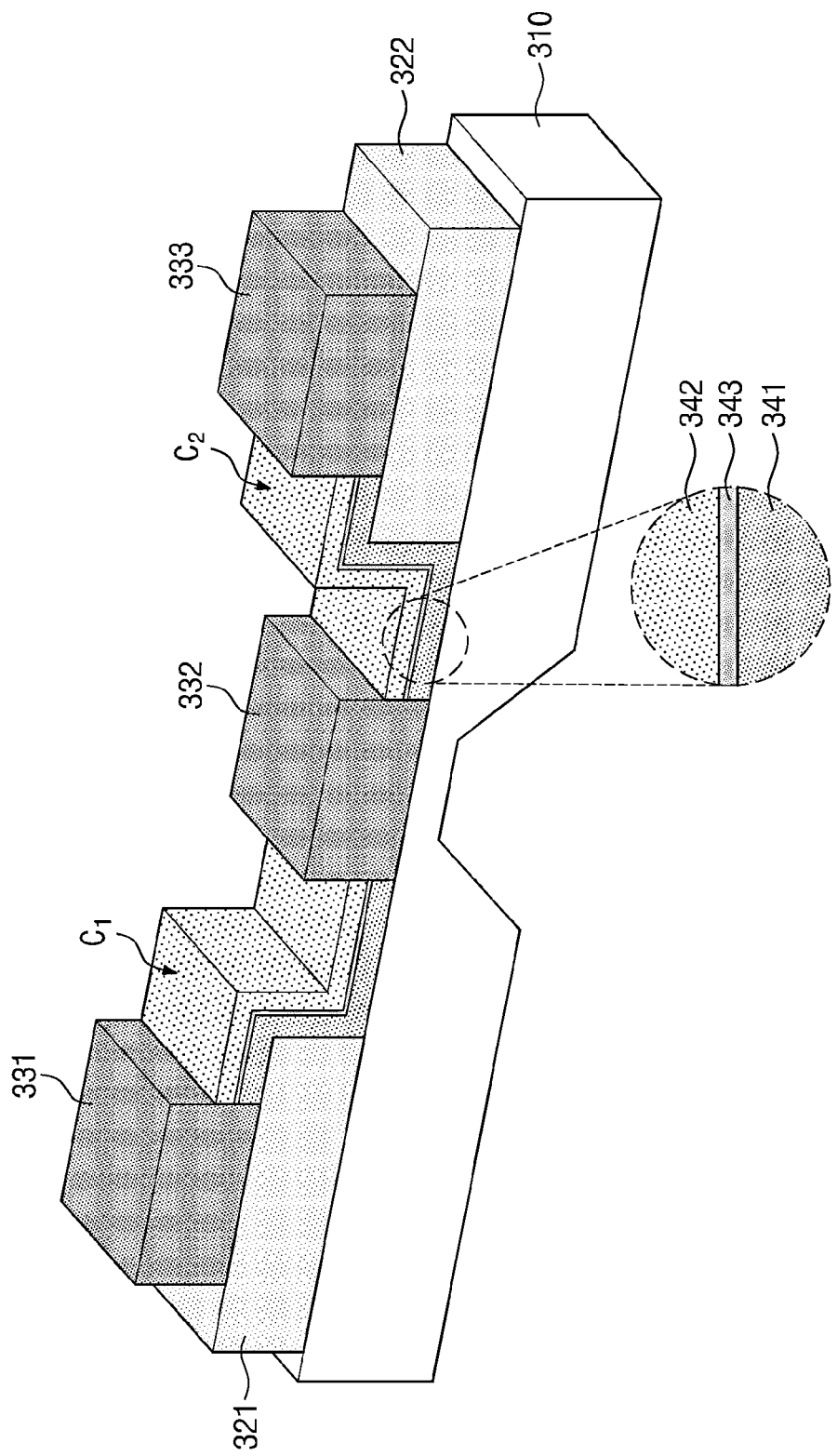
Figure 22:
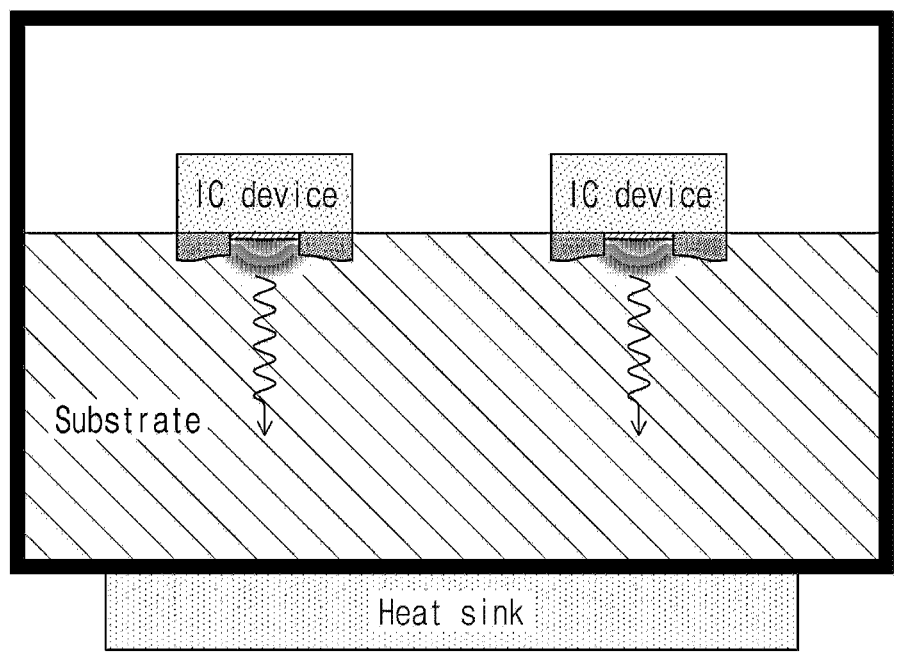
FIG. 22 is a view for explaining the conventional semiconductor cooling.
Figure 23:
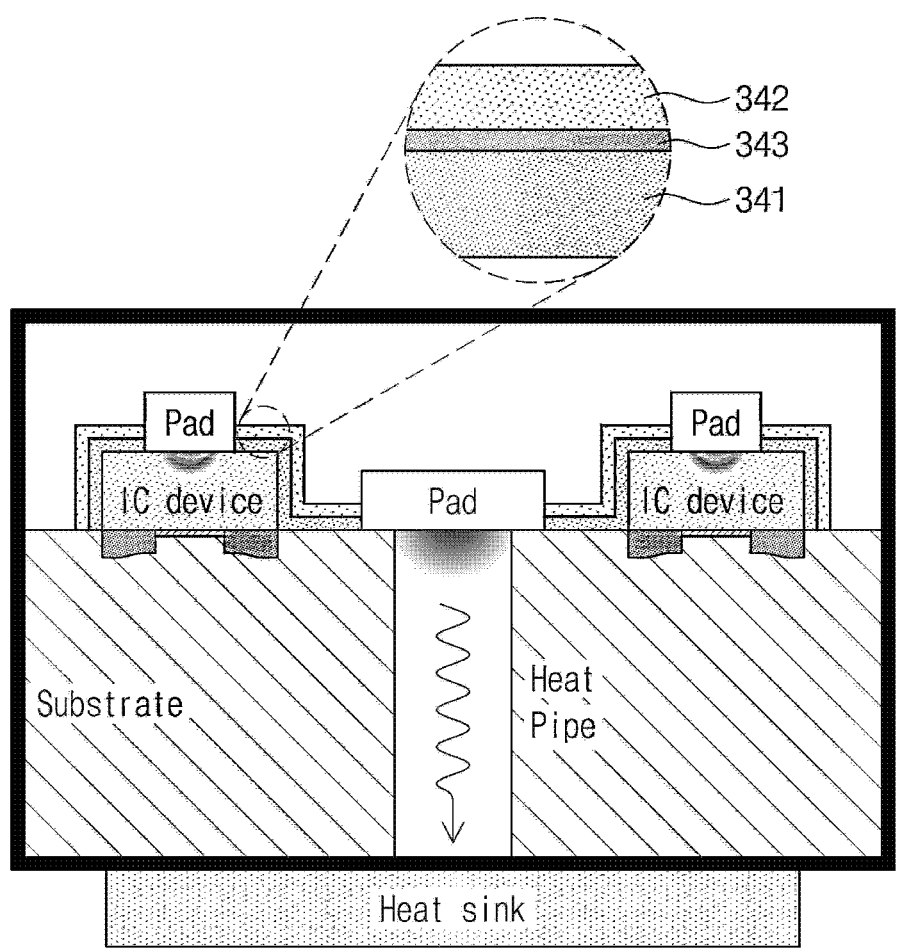
FIG. 23 is a view for explaining a heat dissipation process of the active cooling apparatus according to the first embodiment of the present invention.

FIGS. 20 and 21 are perspective views of an active cooling apparatus according to the first embodiment of the present invention. FIG. 22 is a view for explaining the conventional semiconductor cooling. FIG. 23 is a view for explaining a heat dissipation process of the active cooling apparatus according to the first embodiment of the present invention.

Referring to FIGS. 20 and 21, the active cooling apparatus according to the first embodiment of the present invention may include a substrate 310, a first integrated circuit structure 321, a second integrated circuit structure 322, a first metal pad 331, a second metal pad 332, a third metal pad 333, a first channel C1, and a second channel C2. According to one embodiment, the first to third metal pads 331, 332 and 333, the first channel C1 and the second channel C2 may be defined as a thermoelectric element. Hereinafter, each component will be described.

The first integrated circuit structure 321 and the second integrated circuit structure 322 may be disposed on the substrate 310, and spaced apart from each other. According to one embodiment, the first metal pad 331 and the third metal pad 333 may serve as a hot junction, however, the second metal pad 332 may serve as a cold junction.

The first metal pad 331 may be disposed on the first integrated circuit structure 321, and the third metal pad 333 may be disposed on the second integrated circuit structure 322. On the contrary, the second metal pad 332 may be disposed on the substrate 310, so as to be disposed between the first integrated circuit structure 321 and the second integrated circuit structure 322.

The first channel C1 may be disposed on the substrate 310 to connect the first metal pad 331 to the second metal pad 332. The second channel C2 may be disposed on the substrate 310 to connect the second metal pad 332 to the third metal pad 333. According to one embodiment, the first channel C1 and the second channel C2 may include any one of two-dimensional electron gas (2DEG) and two-dimensional hole gas (2DHG). According to one embodiment, the method of generating the two-dimensional electron gas (2DEG) and the two-dimensional hole gas (2DHG) may be the same as the method of generating the two-dimensional electron gas 130 and the two-dimensional hole gas 230 described with reference to FIG. 16.

Accordingly, heat generated from the first and second integrated circuit structures 321 and 322 may be transferred to the first and third metal pads 331 and 333 and then dissipated along the first and second channels C1 and C2. Accordingly, the active cooling apparatus according to the embodiment of the present invention may achieve inner packaging cooling.

More specifically, as shown in FIG. 22, since the conventional semiconductor cannot achieve cooling inside the packaging, the cooling is achieved outside the packaging. However, as shown in FIG. 23, in the active cooling apparatus according to the embodiment of the present invention, the heat generated from the first and second integrated circuit structures 321 and 322 may be transferred to the first and third metal pads 331 and 333, and then moved to the second metal pad 332 along the first and second channels C1 and C2, so as to be actively cooled. Accordingly, the cooling inside the packaging can be achieved.

Figure 24:
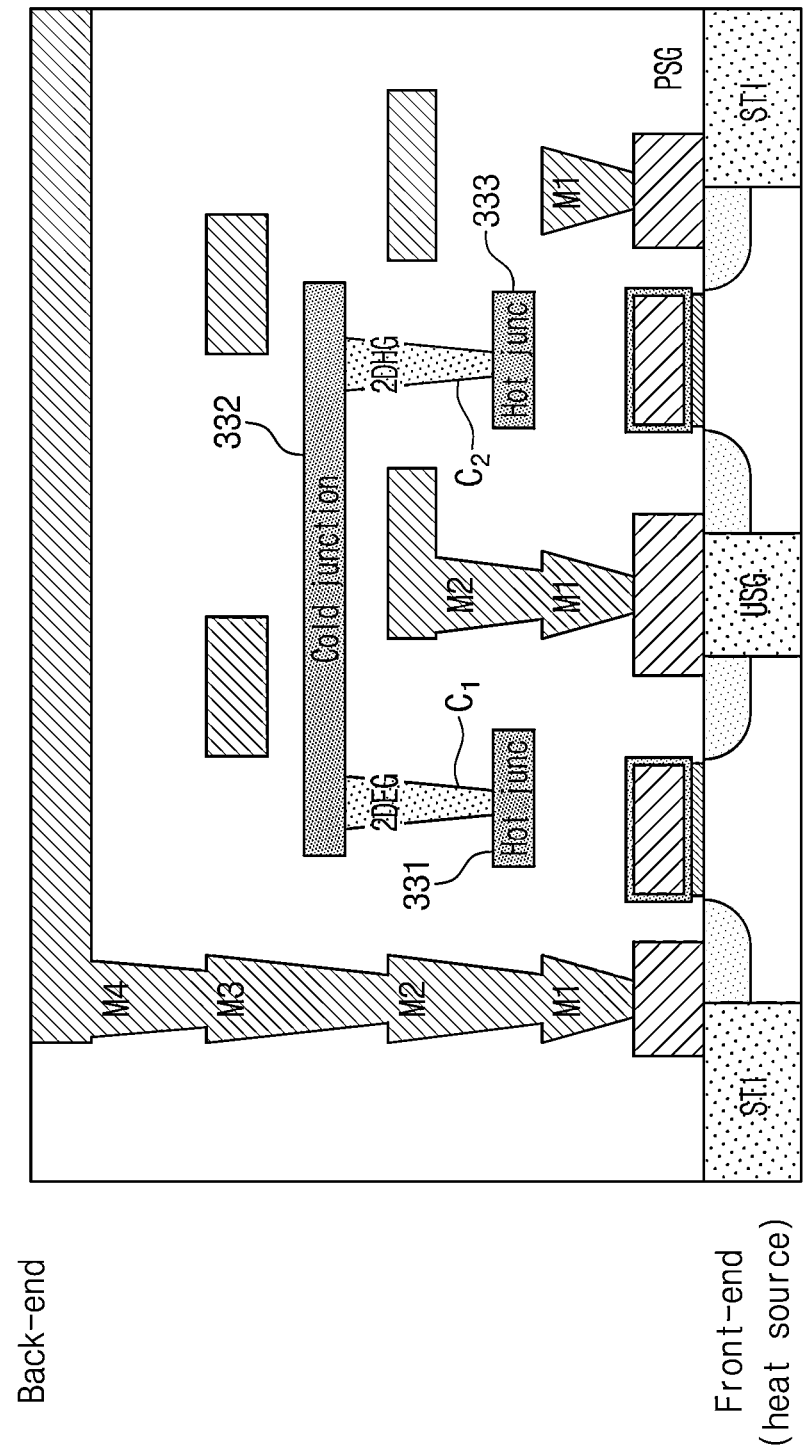
FIG. 24 is a view for explaining an active cooling apparatus according to a second embodiment of the present invention.

FIG. 24 is a view for explaining an active cooling apparatus according to a second embodiment of the present invention.

Referring to FIG. 24, the active cooling apparatus according to a second embodiment of the present invention may have a structure in which a thermoelectric element including the first metal pad 331, the second metal pad 332, the third metal pad 333, the first channel C1, and the second channel C2 is applied inside an on-chip.

More specifically, the first and third metal pads 331 and 333 may be applied as a hot junction, however, the second metal pad 332 may be applied as a cold junction.

The first channel C1 may be formed on the first metal pad 331, and the second channel C2 may be formed on the third metal pad 333. In addition, one end of the first channel C1 may be connected to one end of the second channel C2 through the second metal pad 332. According to one embodiment, the first channel C1 may include two-dimensional electron gas 2DEG. On the contrary, the second channel C2 may include two-dimensional hole gas 2DHG.

Figure 25:
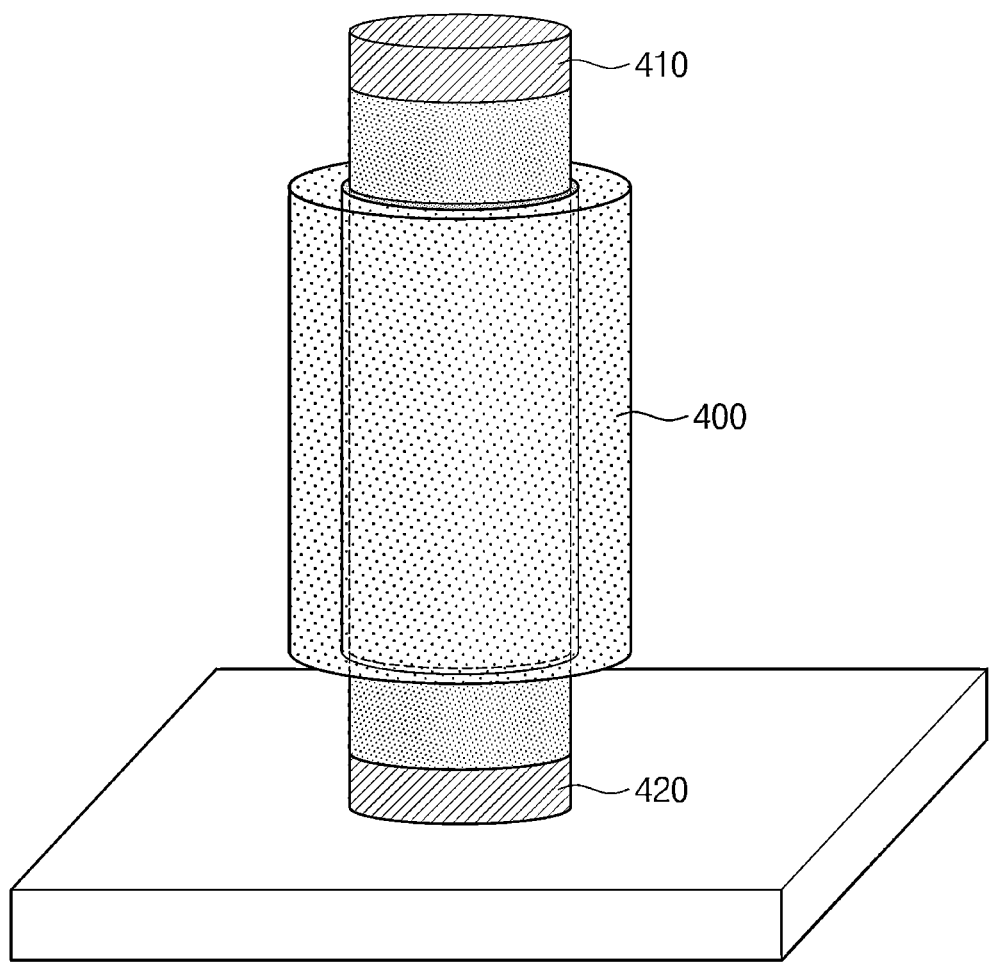
FIG. 25 is a view for explaining a transistor according to the embodiment of the invention.
Figure 26:
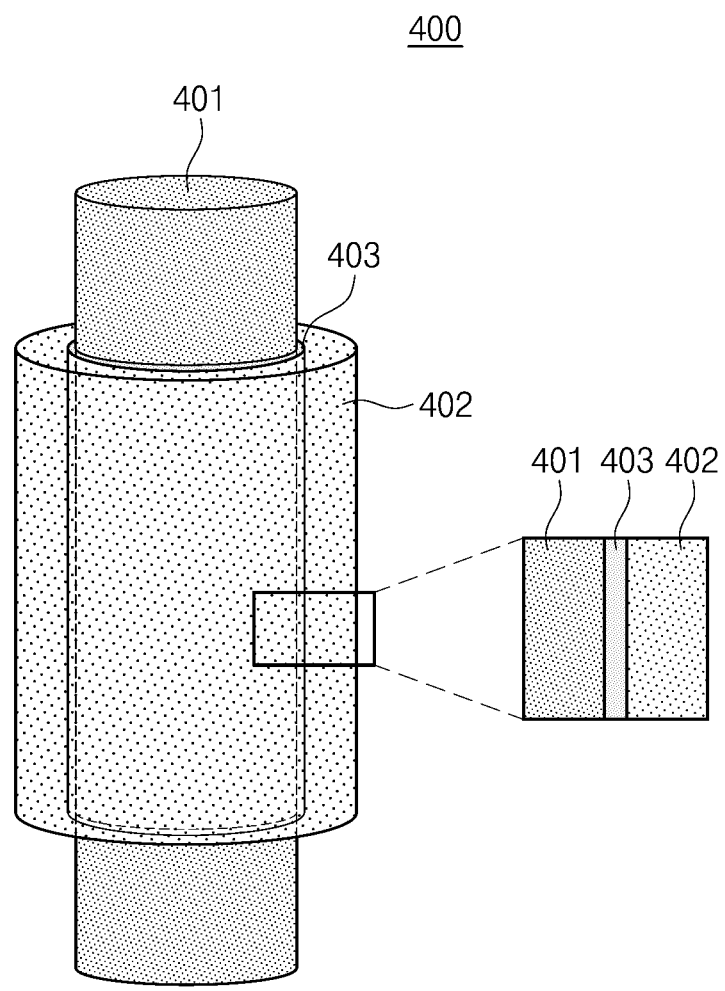
FIG. 26 is a view for explaining a gate of the transistor according to the embodiment of the invention.

FIG. 25 is a view for explaining a transistor according to the embodiment of the invention. FIG. 26 is a view for explaining a gate of the transistor according to the embodiment of the invention.

Referring to FIGS. 25 and 26, the transistor according to the embodiment of the present invention may include a gate 400, a source electrode 410, and a drain electrode 420. More specifically, the gate 400 may include a base substrate 401 in the form of a nano wire, a material film 402 for covering a part of the base substrate 401, and two-dimensional electron gas 403 generated between the base substrate 401 and the material film 402. According to one embodiment, the base substrate 401 may include the first binary metal oxide, and the material film 402 may include the second binary metal oxide. Accordingly, the two-dimensional electron gas 403 may be generated between the base substrate 401 and the material film 402.

The thermoelectric element, the active cooling apparatus, and the transistor according to the embodiment of the present invention have been described. Hereinafter, specific characteristic evaluation results of the thermoelectric composite according to the Experimental Examples of the present invention will be described.

Figure 27:
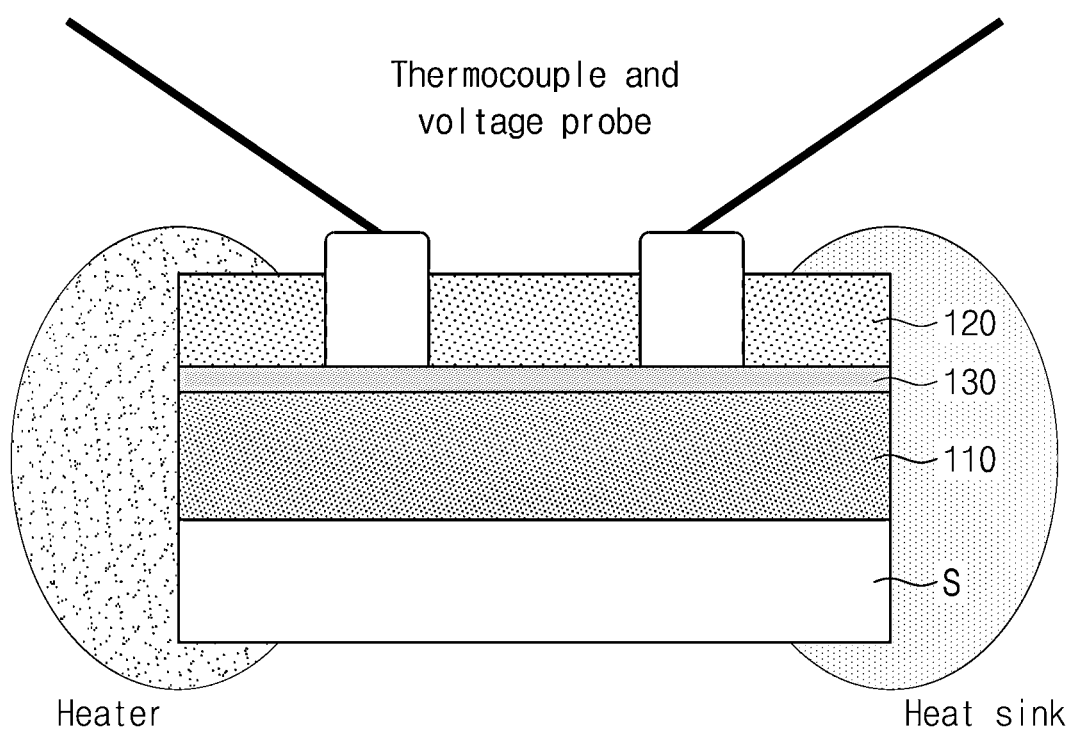
FIG. 27 is a schematic diagram for measuring the thermoelectric properties of the thermoelectric composite according to the Experimental Examples of the present invention.

FIG. 27 is a schematic diagram for measuring the thermoelectric properties of the thermoelectric composite according to the Experimental Examples of the present invention.

Preparation of Thermoelectric Composite According to Experimental Example

As shown in FIG. 27, a thermoelectric composite, which includes a quartz substrate S, a ZnO material film 110 formed on the quartz substrate S, an $Al_2O_3$ material film 120 formed on the ZnO material film 110, and two-dimensional electron gas 130 generated between the ZnO material film 110 and the $Al_2O_3$ material film 120, is manufactured.

More specifically, both of the ZnO material film 110 and the $Al_2O_3$ material film 120 are famed through the atomic layer deposition (ALD) process, the ZnO material film 110 has a thickness of 5 nm, and the $Al_2O_3$ material film 120 has a thickness of 3 nm.

Thereafter, a heater is formed on one side of the thermoelectric composite and a heat sink is formed on the other side, and then thermoelectric properties of the thermoelectric composite is measured using a thermocouple and a voltage probe.

Figure 28:
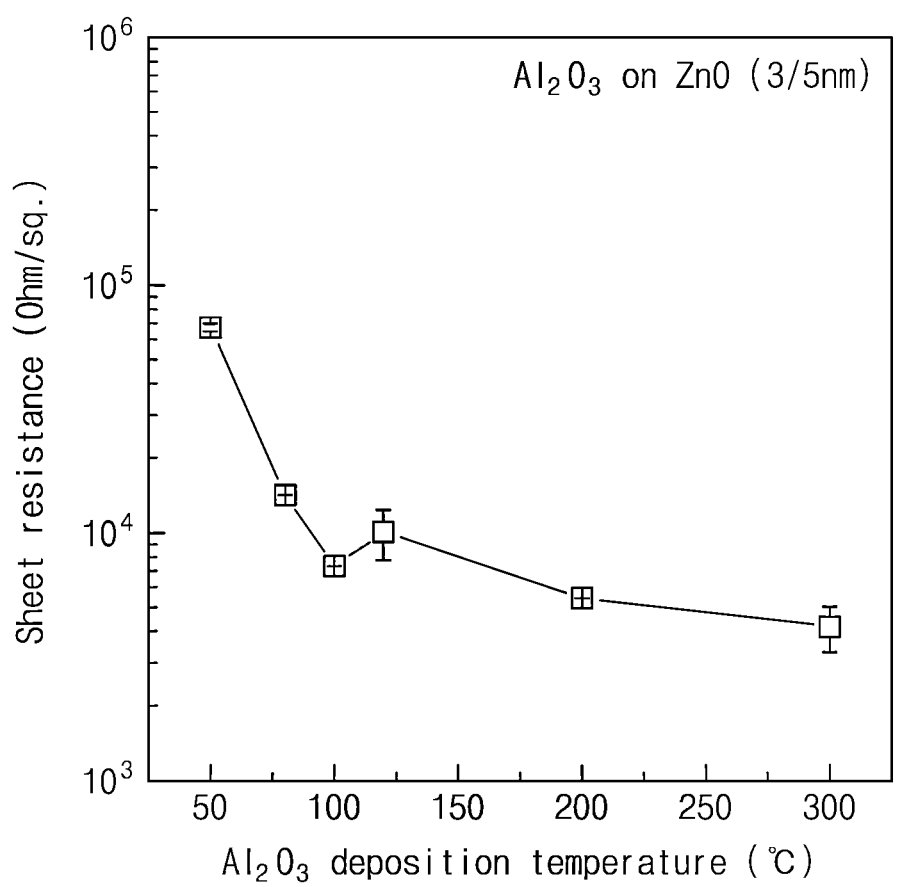
FIG. 28 is a graph showing a sheet resistance at an interface according to an $Al_2O_3$ material film formation temperature of the thermoelectric composite according to the Experimental Examples of the present invention.

FIG. 28 is a graph showing a sheet resistance at an interface according to an $Al_2O_3$ material film formation temperature of the thermoelectric composite according to the Experimental Examples of the present invention.

FIG. 28 shows that the thermoelectric composite including an $Al_2O_3$ material film formed at a temperature of 50° C. to 300° C. according to the Experimental Example is prepared and then a sheet resistance (Ohm/sq.) at an interface between the ZnO material film and the $Al_2O_3$ material film is measured.

As can be seen in FIG. 28, it is confirmed that the sheet resistance at the interface is also decreased when the process temperature for producing the $Al_2O_3$ material film is increased. However, it is confirmed that the sheet resistance is saturated and substantially kept constant when the process temperature for producing the $Al_2O_3$ material film exceeds 100° C.

Figure 29:
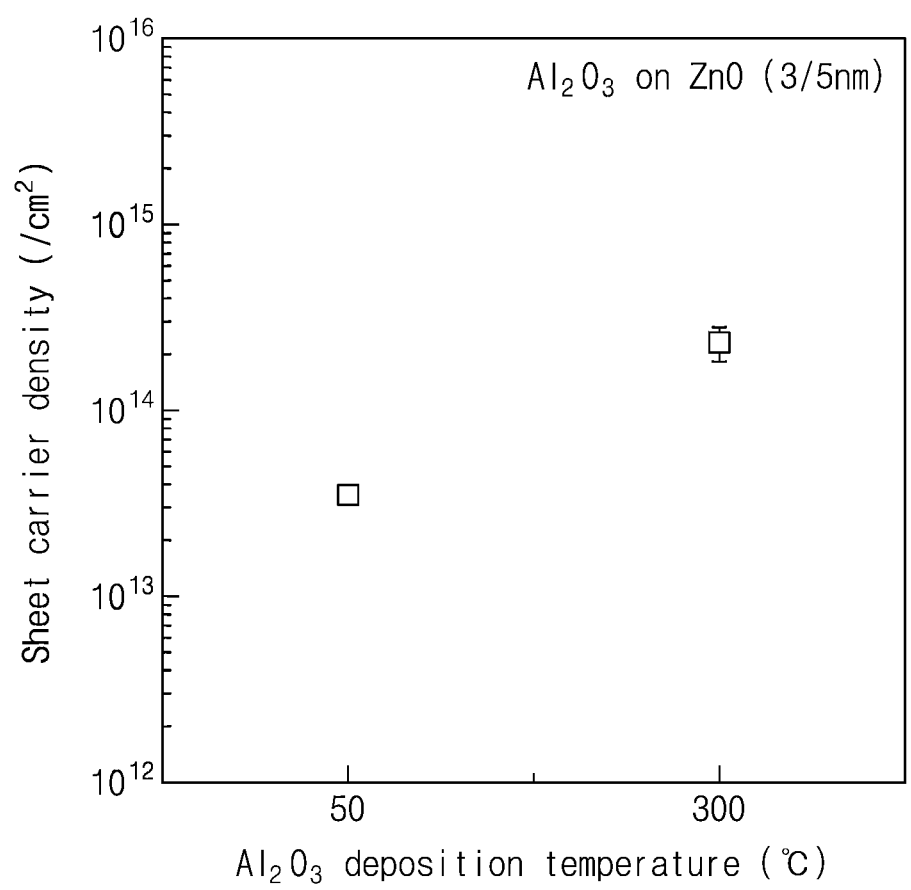
FIG. 29 is a graph showing a carrier density at the interface according to the $Al_2O_3$ material film formation temperature of the thermoelectric composite according to the Experimental Examples of the present invention.

FIG. 29 is a graph showing a carrier density at the interface according to the $Al_2O_3$ material film formation temperature of the thermoelectric composite according to the Experimental Examples of the present invention. More specifically, in FIG. 29, the thermoelectric composite having a relatively low carrier density represents a thermoelectric composite having an $Al_2O_3$ material film formed at a temperature of 50° C., and the thermoelectric composite having a relatively high carrier density represents a thermoelectric composite having an $Al_2O_3$ material film formed at a temperature of 300° C.

FIG. 29 shows that the thermoelectric composite containing the $Al_2O_3$ material film formed at temperatures of 50° C. and 300° C. according to the Experimental Example is prepared and then a carrier density ($cm^{-2}$) at the interface between the ZnO material film and the $Al_2O_3$ material film is measured. As shown in FIG. 29, it is confirmed that the carrier density at the interface is increased when the process temperature for producing the $Al_2O_3$ material film is increased from 50° C. to 300° C.

Figure 30:
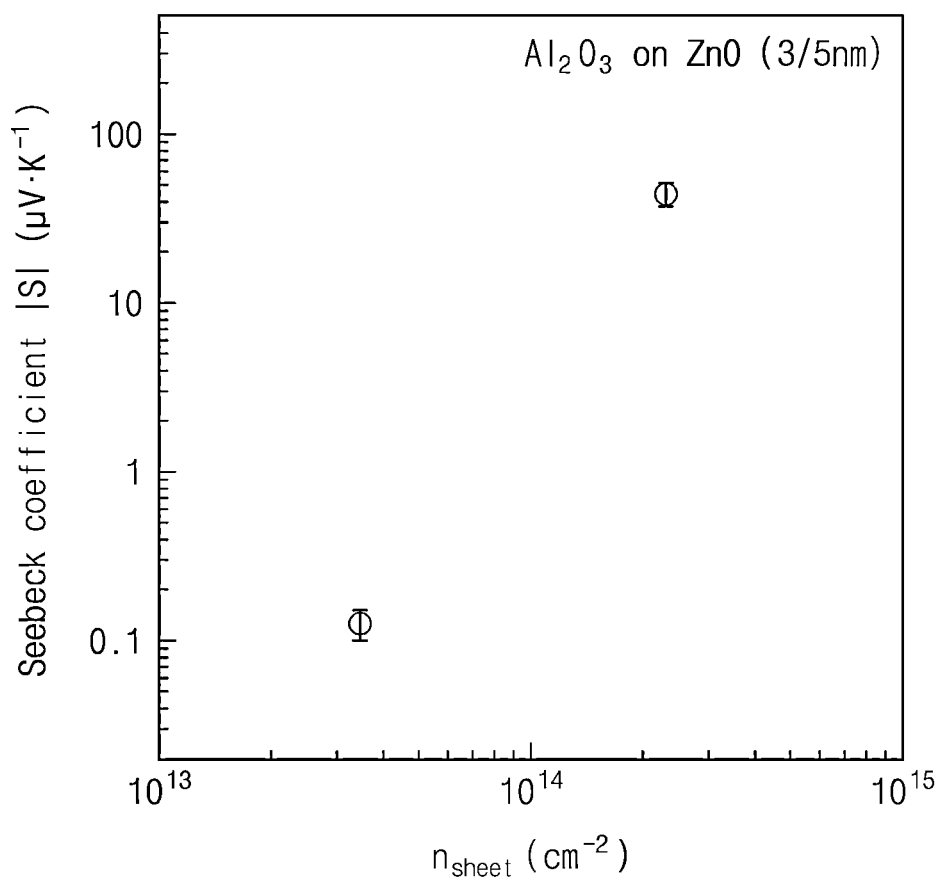
FIG. 30 is a graph showing the Seebeck coefficient according to the carrier density at the interface of the thermoelectric composite according to the Experimental Examples of the present invention.

FIG. 30 is a graph showing the Seebeck coefficient according to the carrier density at the interface of the thermoelectric composite according to the Experimental Examples of the present invention.

FIG. 30 shows that thermoelectric composites having different carrier densities ($n_{sheet}$, $cm^{-2}$) at the interface between the ZnO material film and the $Al_2O_3$ material film are prepared and then each Seebeck coefficient ($|S|\mu V \cdot K^{-1}$) is measured.

As shown in FIG. 30, it is confirmed that the Seebeck coefficient of the thermoelectric composite is also increased when the carrier density at the interface between the ZnO material film and the $Al_2O_3$ material film is increased. In other words, it is confirmed that the thermoelectric element to which the thermoelectric composite according to the embodiment of the present invention is applied has the characteristics in which the carrier density and the Seebeck coefficient are proportional to each other. In addition, as shown in FIGS. 29 and 30, in the case of the thermoelectric element to which the thermoelectric composite according to the Experimental Examples of the present invention is applied, it is found that the Seebeck coefficient is increased as the formation temperature of the $Al_2O_3$ material film is increased.

Figure 31:
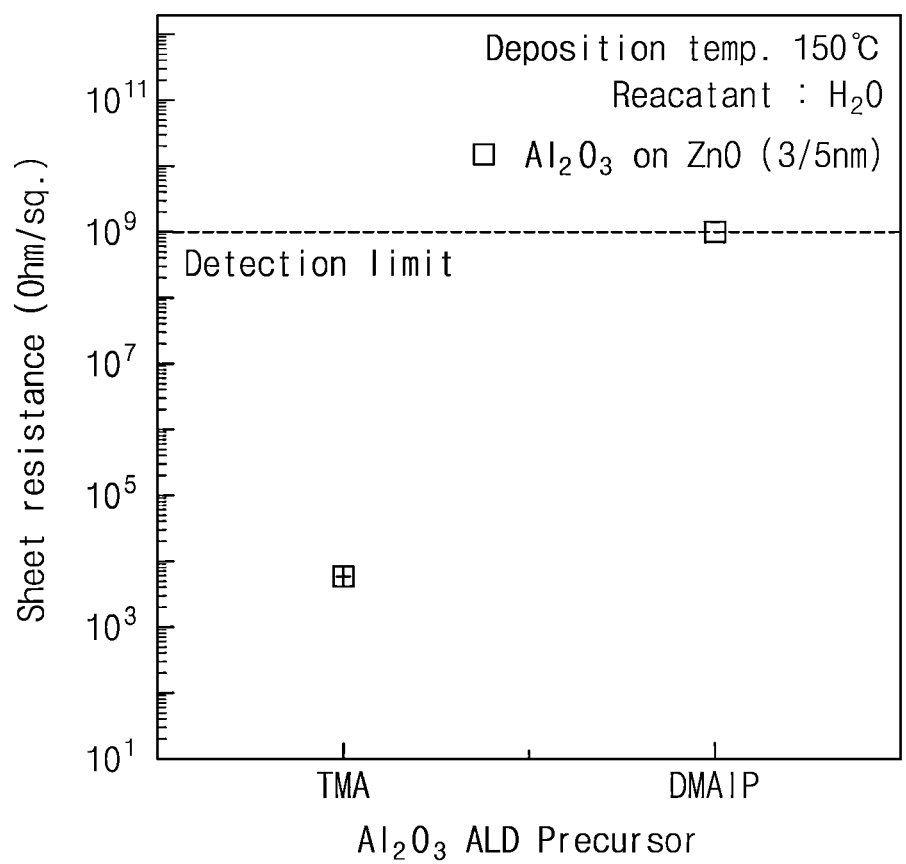
FIG. 31 is a graph comparing a sheet resistance according to a metal precursor used in the manufacturing process of the $Al_2O_3$ material film of the thermoelectric composite according to the Experimental Examples of the present invention.

FIG. 31 is a graph comparing a sheet resistance according to a metal precursor used in the manufacturing process of the $Al_2O_3$ material film of the thermoelectric composite according to the Experimental Examples of the present invention.

FIG. 31 shows that thermoelectric composites containing $Al_2O_3$ material films manufactured using different metal precursors (TMA and DMAIP) are prepared and then each sheet resistance (Ohm/sq.) at the interface between the ZnO material film and the $Al_2O_3$ material film is measured.

As shown in FIG. 31, it is confirmed that the thermoelectric composite containing the $Al_2O_3$ material film manufactured using TMA has the sheet resistance remarkably low compared to the thermoelectric composite containing the $Al_2O_3$ material film manufactured using DMAIP. In particular, it is confirmed that the thermoelectric composite containing the $Al_2O_3$ material film manufactured using DMAIP has the sheet resistance at the interface, which is high up to a detection limit. Accordingly, it is found that the two-dimensional electron gas is generated between the ZnO material film and the $Al_2O_3$ material film when the $Al_2O_3$ material film is manufactured using TMA, however, no two-dimensional electron gas is generated between the ZnO material film and the $Al_2O_3$ material film when the $Al_2O_3$ material film is manufactured using DMAIP.

Figure 32:
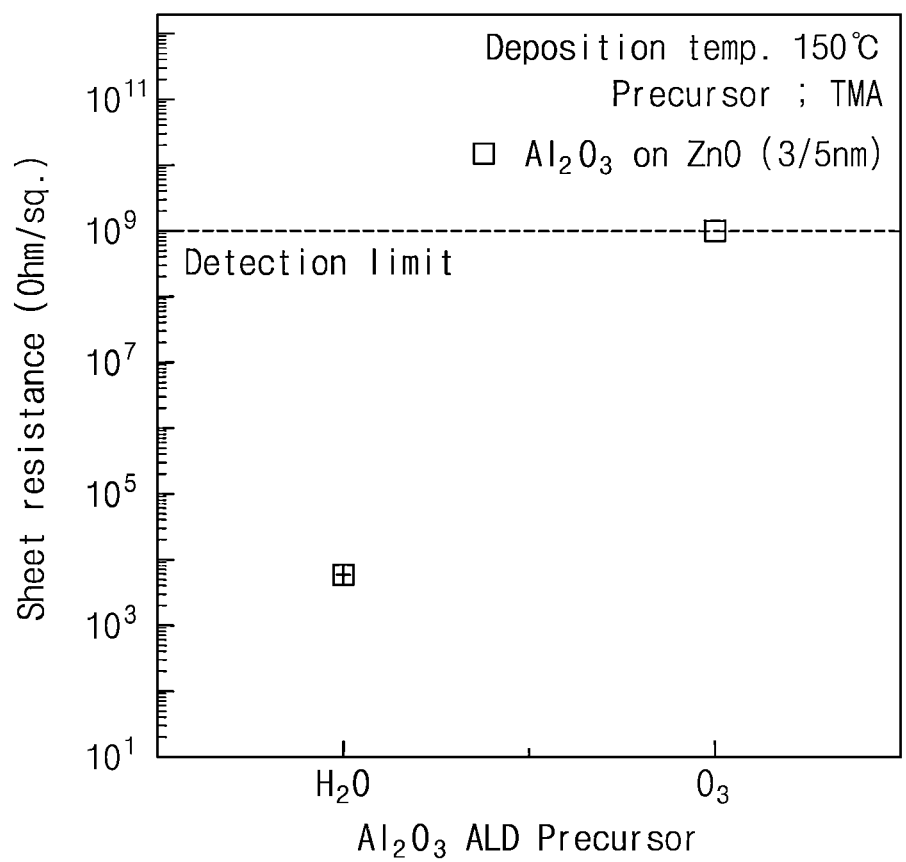
FIG. 32 is a graph comparing a sheet resistance according to a reaction material used in the manufacturing process of the $Al_2O_3$ material film of the thermoelectric composite according to the Experimental Examples of the present invention.

FIG. 32 is a graph comparing a sheet resistance according to a reaction material used in the manufacturing process of the $Al_2O_3$ material film of the thermoelectric composite according to the Experimental Examples of the present invention.

FIG. 32 shows that thermoelectric composites containing $Al_2O_3$ material films manufactured using different reaction materials ($H_2O$ and $O_3$) are prepared and then each sheet resistance (Ohm/sq.) at the interface between the ZnO material film and the $Al_2O_3$ material film is measured.

As shown in FIG. 32, it is confirmed that the thermoelectric composite containing the $Al_2O_3$ material film manufactured using $H_2O$ has the sheet resistance remarkably low compared to the thermoelectric composite containing the $Al_2O_3$ material film manufactured using $O_3$. In particular, it is confirmed that the case of the thermoelectric composite containing the $Al_2O_3$ material film manufactured using $O_3$ has the sheet resistance at the interface, which is high up to a detection limit. Accordingly, it is found that the two-dimensional electron gas is generated between the ZnO material film and the $Al_2O_3$ material film when the $Al_2O_3$ material film is manufactured using $H_2O$, however, no two-dimensional electron gas is generated between the ZnO material film and the $Al_2O_3$ material film when the $Al_2O_3$ material film is manufactured using $O_3$.

Figure 33:
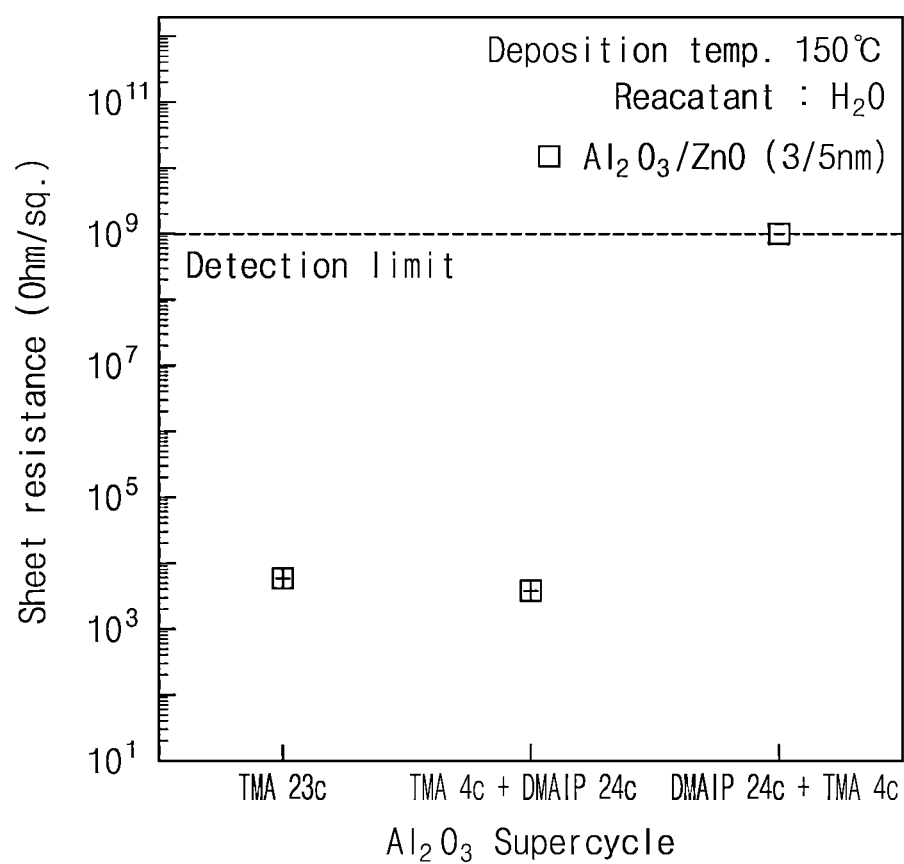
FIG. 33 is a graph comparing sheet resistances of thermoelectric composites according to the Experimental Examples and Comparative Examples of the present invention.
Figure 34A:
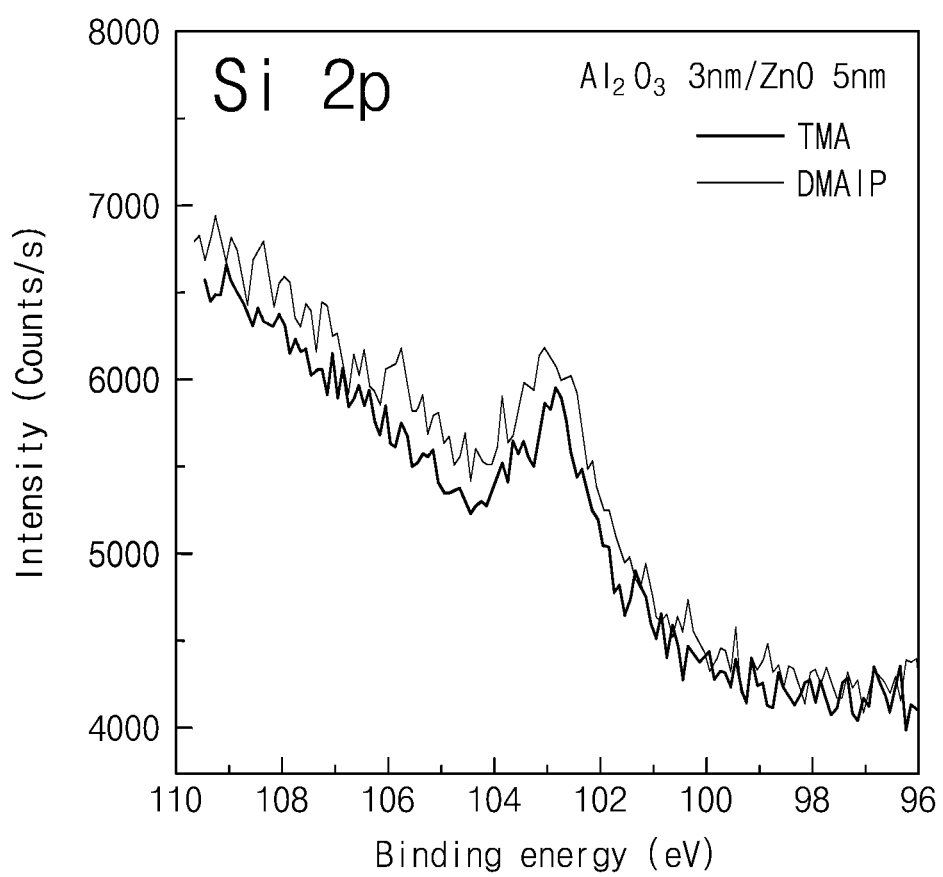
FIGS. 34A to 34D are graphs showing XPS analysis results of the thermoelectric composite according to the Experimental Examples of the present invention.
Figure 34B:
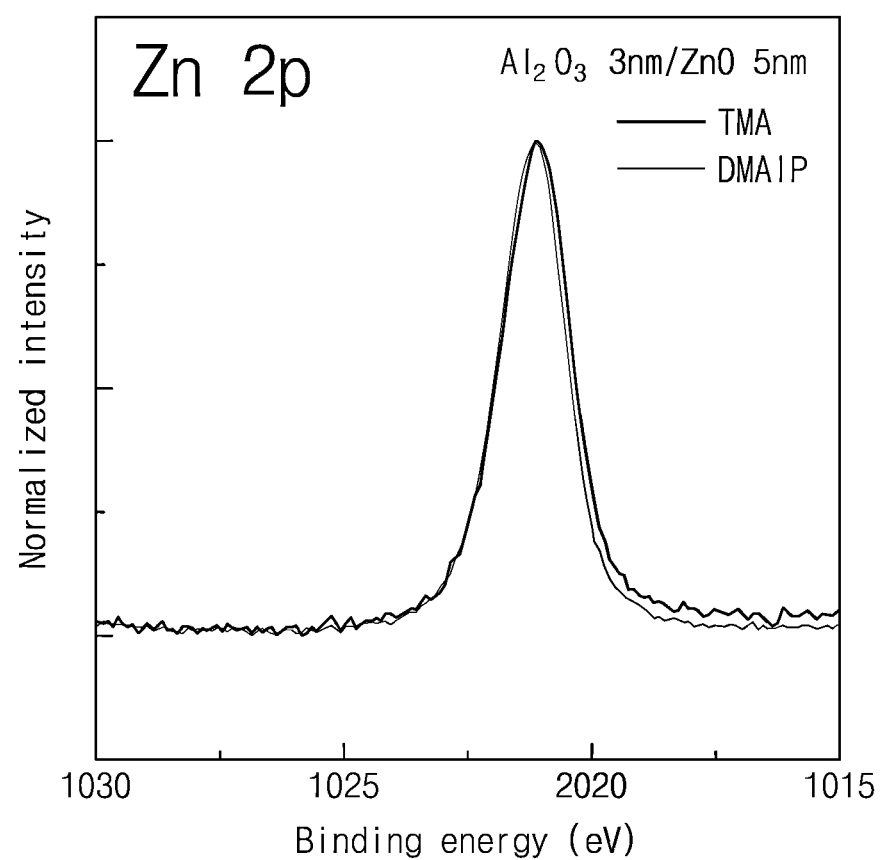
Figure 34C:
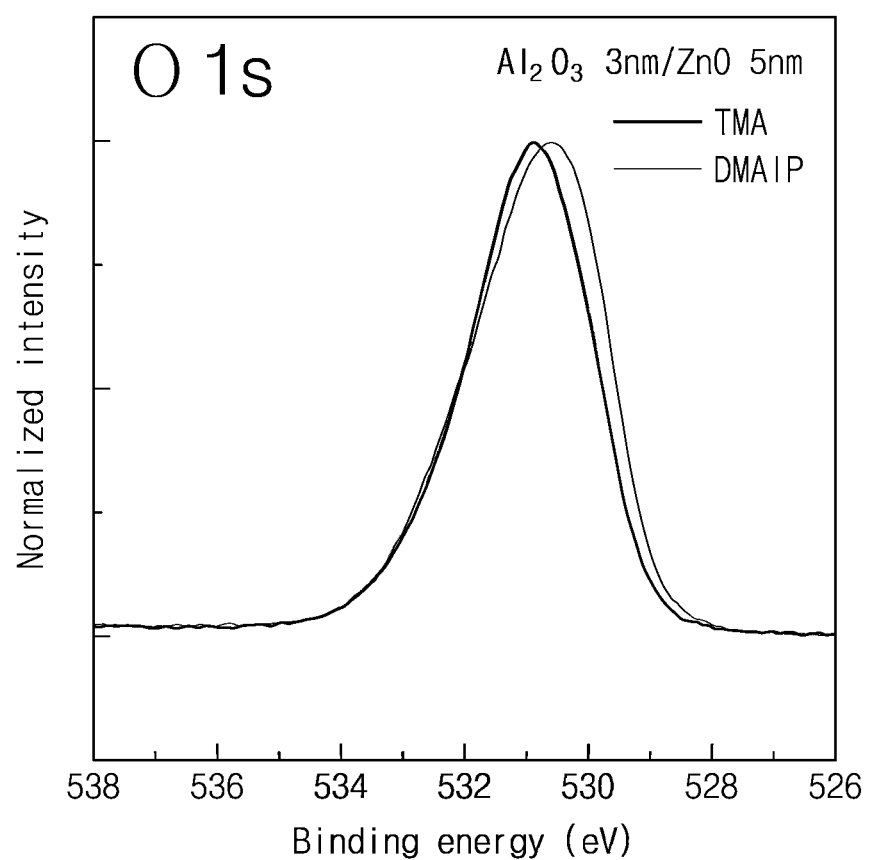
Figure 34D:
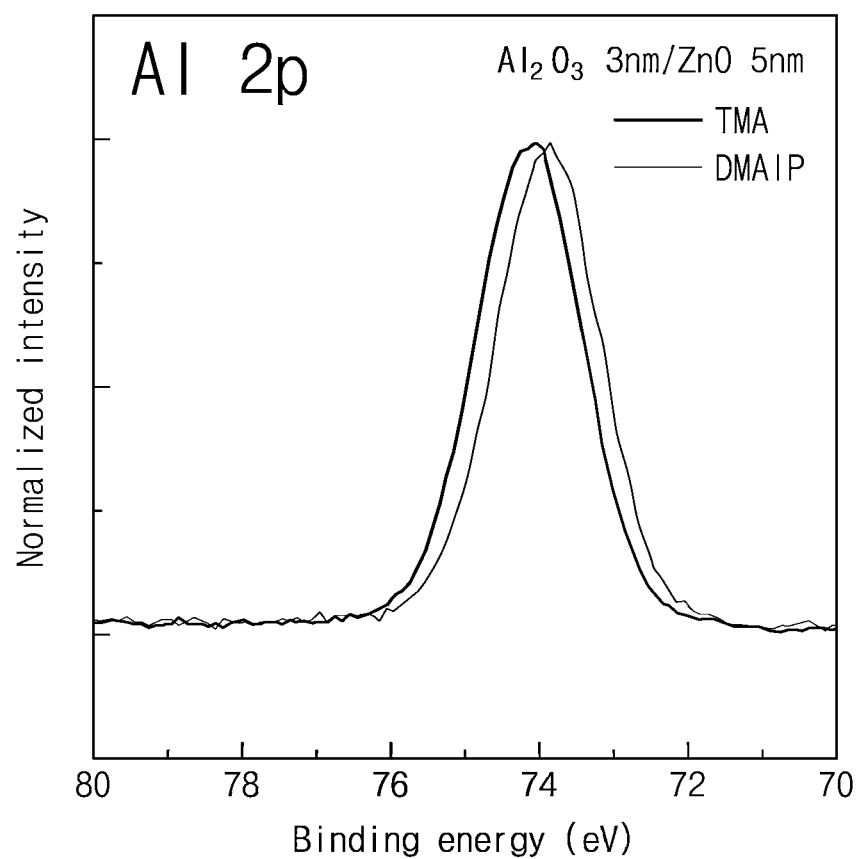

FIG. 33 is a graph comparing sheet resistances of thermoelectric composites according to the Experimental Examples and Comparative Examples of the present invention.

FIG. 33 shows that a thermoelectric composite (TMA 23c) containing an $Al_2O_3$ material film according to Experimental Example 1, a thermoelectric composite (TMA 4c+DMAIP 24c) according to Experimental Example 2, and a thermoelectric composite (DMAIP 24c+TMA 4c) according to Comparative Example 1 are manufactured through different processes and prepared and then, each sheet resistance (Ohm/sq.) is measured.

More specifically, the $Al_2O_3$ material film contained in the thermoelectric composite according to Experimental Example 1 is manufactured by repeating a unit process defined as TMA provision-purge-$H_2O$ provision-purge 23 times. On the contrary, the $Al_2O_3$ material film contained in the thermoelectric composite according to Experimental Example 2 is manufactured by repeating a first unit process defined as TMA provision-purge-$H_2O$ provision-purge 4 times and then repeating a second unit process defined as DMAIP provision-purge-$H_2O$ provision-purge 24 times. On the contrary, the $Al_2O_3$ material film contained in the thermoelectric composite according to Comparative Example 1 is manufactured by repeating the first unit process defined as DMAIP provision-purge-$H_2O$ provision-purge 24 times and then repeating the unit process defined as TMA provision-purge-$H_2O$ provision-purge 4 times. The manufacturing processes of the $Al_2O_3$ material film contained in the thermoelectric composites according to Experimental Example 1, Experimental Example 2, and Comparative Example 1 The following Table 1 summarizes.

TABLE 1

| Experimental Example 1 | TMA-purge-H$_2$O-purge (repeat 23 times) |
|---|---|
| Experimental Example 2 | TMA-purge-H$_2$O-purge (repeat 4 times) followed by DMAIP-purge-H$_2$O-purge (repeat 24 times) |
| Experimental Example 3 | DMAIP-purge-H$_2$O-purge (repeat 24 times) followed by TMA-purge-H$_2$O-purge (repeat 4 times) |

As shown in FIG. 33, it is confirmed that the thermoelectric composite (TMA 23c) containing Al$_2$O$_3$ manufactured by solely using TMA according to Experimental Example 1 represents a sheet resistance of 5944 Ohm/sq, however, the thermoelectric composite (TMA 4c+DMAIP 24c) containing Al$_2$O$_3$ manufactured by using TMA and DMAIP together according to Experimental Example 2 represents a sheet resistance of 3815 Ohm/sq, and accordingly, the sheet resistance is about 36% lower than that of the thermoelectric composite according to Experimental Example 1. Thus, it is found that the electrical properties of the Al$_2$O$_3$ material film manufactured by using TMA and DMAIP together is higher than that of the Al$_2$O$_3$ material film manufactured by solely using TMA.

However, the thermoelectric composite (DMAIP 24c+ TMA 4c) according to Comparative Example 1 represents the sheet resistance higher than the detection limit. Thus, it is found that, in the Al$_2$O$_3$ material film obtained by using DMAIP prior to TMA, no two-dimensional electron gas is generated between the ZnO material film and the Al$_2$O$_3$ material film.

In other words, it is found that, in order to manufacture a thermoelectric composite having high electrical properties, TMA and DMAIP are required to be used together in the process of manufacturing the Al$_2$O$_3$ material film, and TMA is required to be used before DMAIP.

FIGS. 34A to 34D are graphs showing XPS analysis results of the thermoelectric composite according to the Experimental Examples of the present invention.

FIGS. 34A to 34D show the results in which thermoelectric composites containing Al$_2$O$_3$ material films manufactured using different metal precursors (TMA and DMAIP) are prepared and then an X-ray photoelectron spectroscopy (XPS) analysis is performed on each thermoelectric composite. As can be seen in FIGS. 34A to 34D, the Al$_2$O$_3$ material film manufactured using TMA has the typical O 1s is peak (531 eV) and Al 2p peak (74.2 eV) of Al$_2$O$_3$.

Although the present invention has been described in detail by using exemplary embodiments, the scope of the present invention is not limited to the specific embodiments, and shall be interpreted by the appended claims. In addition, it will be apparent that a person having ordinary skill in the art may carry out various deformations and modifications for the embodiments described as above within the scope without departing from the present invention.

INDUSTRIAL APPLICABILITY

The thermoelectric composite, the preparation method for the same, and the thermoelectric element including the thermoelectric composite according to the embodiment of the present invention may be applied to the semiconductor field.

The invention claimed is:

1. A preparation method for a thermoelectric composite, the preparation method comprising:
    preparing a base substrate containing a first binary metal oxide; and
    providing a metal precursor and a reaction material containing oxygen (O) onto the base substrate to form a material film containing a second binary metal oxide resulting from reaction of the metal precursor and the reaction material,
    wherein forming the material film includes generating a 2-dimensional electron gas between the base substrate and the material film as the material film is formed on the base substrate; and
    wherein a process temperature for forming the material film is controlled, so that a sheet resistance at an interface between the base substrate and the material film is controlled.

2. The preparation method of claim 1, wherein forming the material film includes:
    providing a first metal precursor and the reaction material on the base substrate; and
    after providing the first metal precursor and the reaction material on the base substrate, providing a second metal precursor and the reaction material on the base substrate.

3. The preparation method of claim 2, wherein
    the first metal precursor includes trimethylaluminum (TMA), and
    the second metal precursor includes dimethylaluminumisopropoxide (DMAIP).

4. The preparation method of claim 2, wherein
    providing the first metal precursor and the reaction material is defined as a first unit process,
    providing the second metal precursor and the reaction material is defined as a second unit process, and
    each of the first unit process and the second unit process is repeatedly performed multiple times.

5. A preparation method for a thermoelectric composite, the preparation method comprising:
    preparing a base substrate containing a first binary metal oxide; and
    providing a metal precursor and a reaction material containing oxygen (O) onto the base substrate to form a material film containing a second binary metal oxide resulting from reaction of the metal precursor and the reaction material;
    wherein forming the material film includes generating a 2-dimensional electron gas between the base substrate and the material film as the material film is formed on the base substrate; and
    wherein a process temperature for forming the material film is controlled, so that a carrier density at an interface between the base substrate and the material film is controlled.

6. The preparation method of claim 5, wherein the reaction material includes water (H$_2$O).

* * * * *